United States Patent
Rivoir

(10) Patent No.: US 11,105,855 B2
(45) Date of Patent: Aug. 31, 2021

(54) TESTER AND METHOD FOR TESTING A DEVICE UNDER TEST AND TESTER AND METHOD FOR DETERMINING A SINGLE DECISION FUNCTION

(71) Applicant: Advantest Corporation, Tokyo (JP)

(72) Inventor: Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 120 days.

(21) Appl. No.: 16/545,299

(22) Filed: Aug. 20, 2019

(65) Prior Publication Data

US 2019/0377027 A1  Dec. 12, 2019

Related U.S. Application Data

(63) Continuation of application No. PCT/EP2017/055368, filed on Mar. 7, 2017.

(51) Int. Cl.
| | | |
|---|---|---|
| *G01R 31/319* | (2006.01) | |
| *G01R 31/317* | (2006.01) | |
| *G01R 31/28* | (2006.01) | |
| *G06F 11/22* | (2006.01) | |

(52) U.S. Cl.
CPC ... *G01R 31/31917* (2013.01); *G01R 31/2846* (2013.01); *G01R 31/2894* (2013.01); *G01R 31/31702* (2013.01); *G01R 31/31707* (2013.01); *G01R 31/31708* (2013.01); *G06F 11/22* (2013.01)

(58) Field of Classification Search
CPC .......... G01R 31/31917; G01R 31/2846; G01R 31/2894; G01R 31/31702; G01R 31/31707; G01R 31/31708; G06F 11/22
See application file for complete search history.

(56) References Cited

U.S. PATENT DOCUMENTS

| | | | |
|---|---|---|---|
| 5,615,380 A | 3/1997 | Hyatt | |
| 6,885,700 B1 | 4/2005 | Kim et al. | |
| 7,676,703 B2 * | 3/2010 | Uwatoko | G06N 7/005 714/48 |
| 7,865,340 B2 * | 1/2011 | Fine | G06F 30/3323 703/2 |
| 8,706,062 B1 | 4/2014 | Yu et al. | |
| 8,756,460 B2 * | 6/2014 | Blue | G06F 11/3676 714/38.1 |
| 2003/0058148 A1 | 3/2003 | Sheen | |
| 2005/0104597 A1 | 5/2005 | Klijn et al. | |
| 2005/0172181 A1 | 8/2005 | Huliehel | |

(Continued)

Primary Examiner — Cynthia Britt

(57) ABSTRACT

An apparatus for determining a single decision function is configured to obtain measurements from a plurality of devices under test corresponding to stimulating signals applied to the plurality of devices under test. The stimulating signals correspond to a set of tests performed on the plurality of devices under test. The apparatus may further determine a subset of tests from the set of tests, such that the subset of tests is relevant for indicating whether the plurality of devices under test pass the set of tests. The apparatus may also determine the single decision function applicable to measurements from an additional device under test tested using the subset of tests, such that the single decision function is adapted to predict a test result for the set of tests on the basis of the subset of tests.

20 Claims, 27 Drawing Sheets

(56) References Cited

U.S. PATENT DOCUMENTS

| | | |
|---|---|---|
| 2008/0109686 A1* | 5/2008 | Nikaido .......... G01R 31/318511 |
| | | 714/57 |
| 2008/0172644 A1* | 7/2008 | Osawa .................. G06F 30/398 |
| | | 716/111 |
| 2010/0176815 A1 | 7/2010 | Roth |
| 2011/0227767 A1 | 9/2011 | O'Brien |
| 2012/0221283 A1 | 8/2012 | Lee |
| 2013/0103328 A1 | 4/2013 | Sakaguchi |
| 2014/0195870 A1 | 7/2014 | Ma |
| 2014/0281719 A1 | 9/2014 | Zlotnick |
| 2014/0336958 A1 | 11/2014 | Rivoir |
| 2014/0380277 A1 | 12/2014 | Bhagavatula |

* cited by examiner

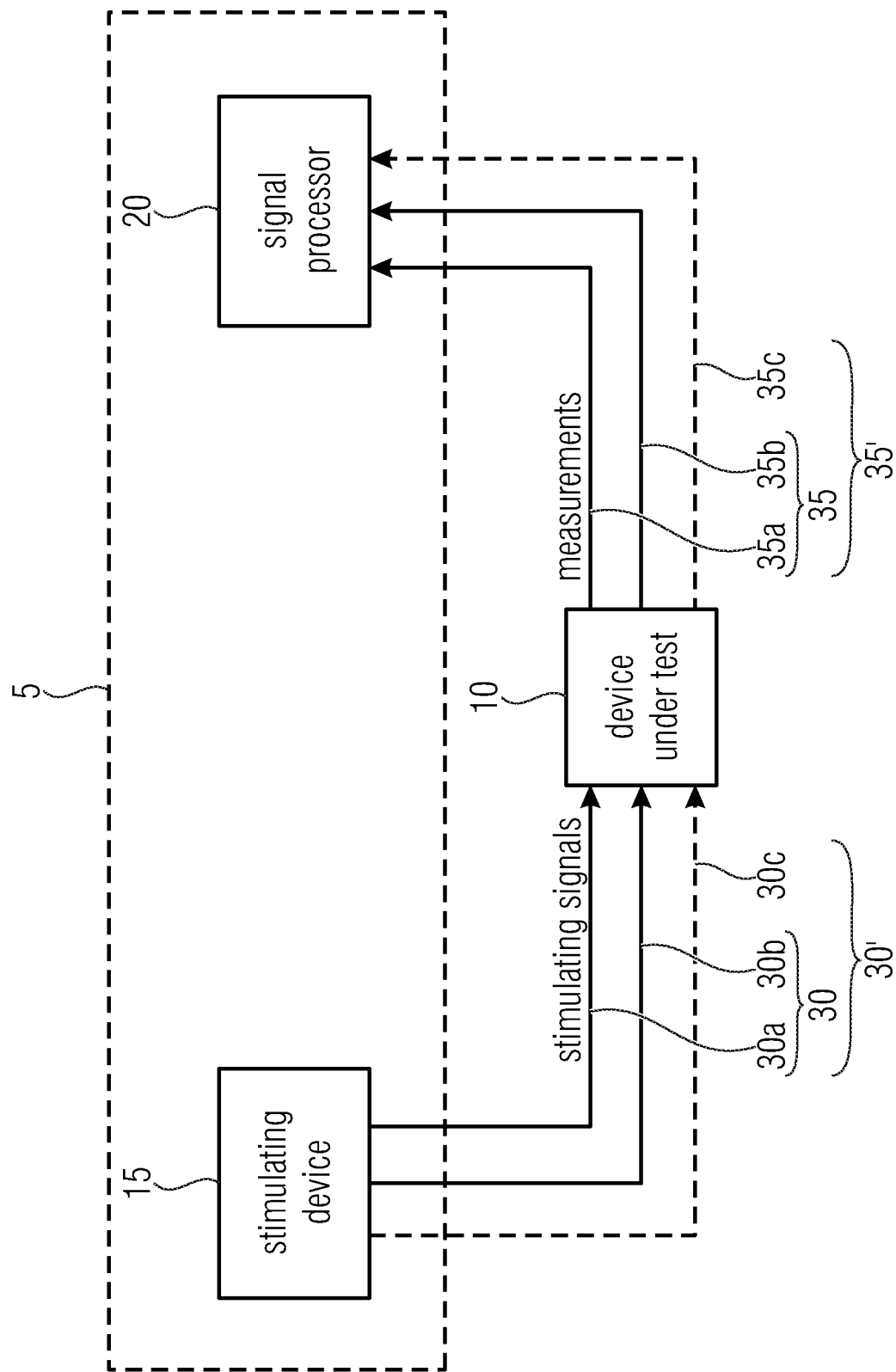

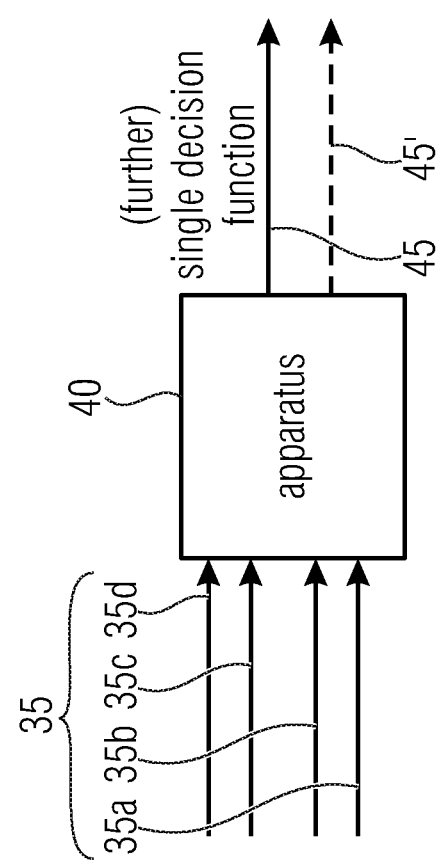

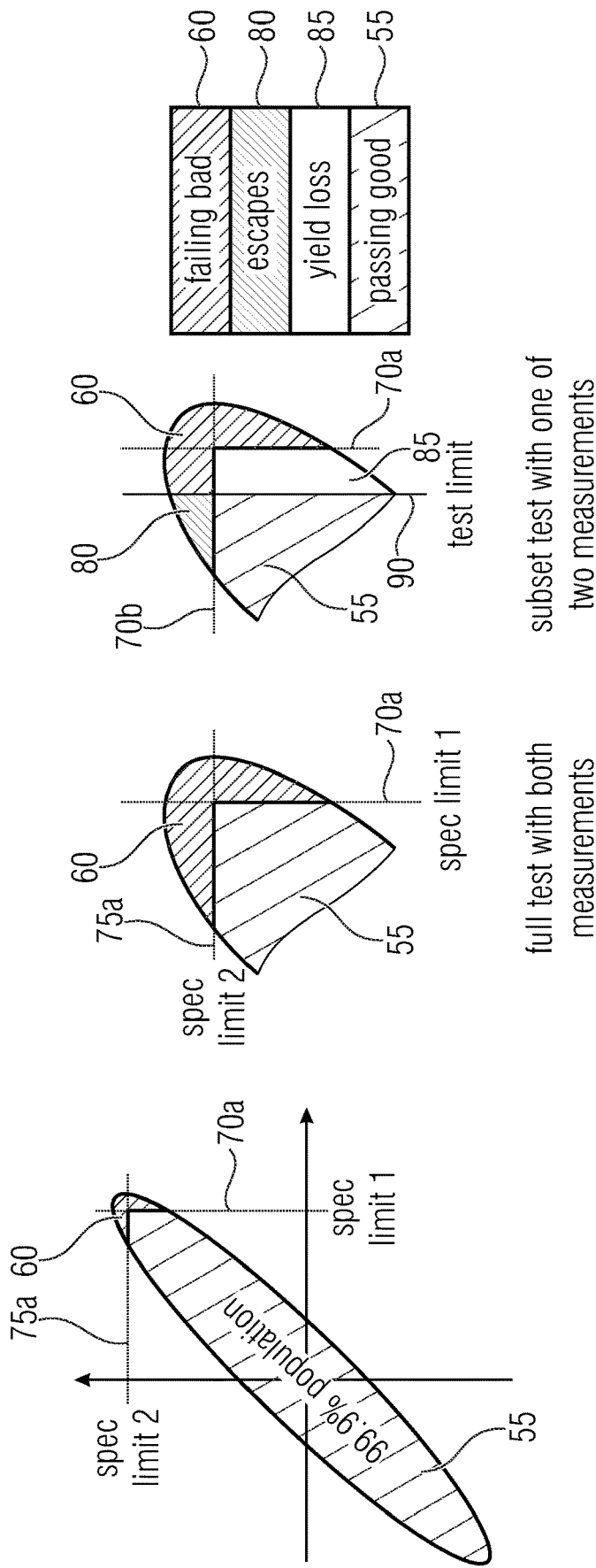

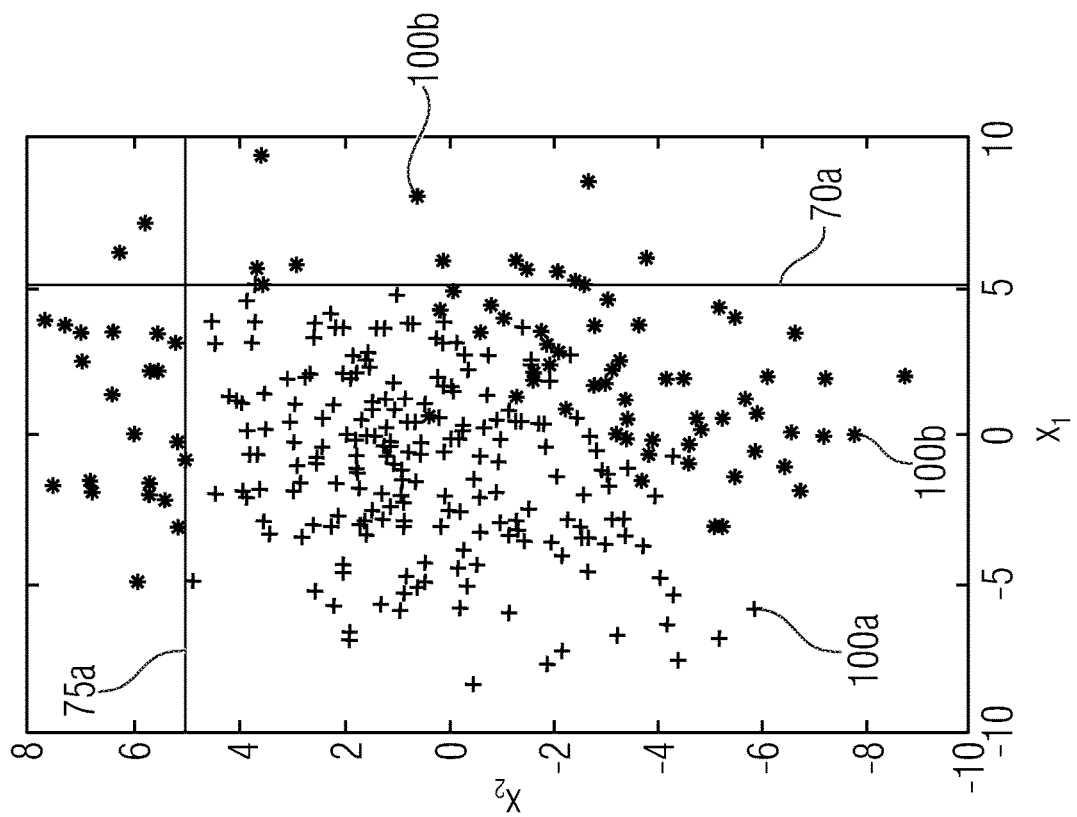
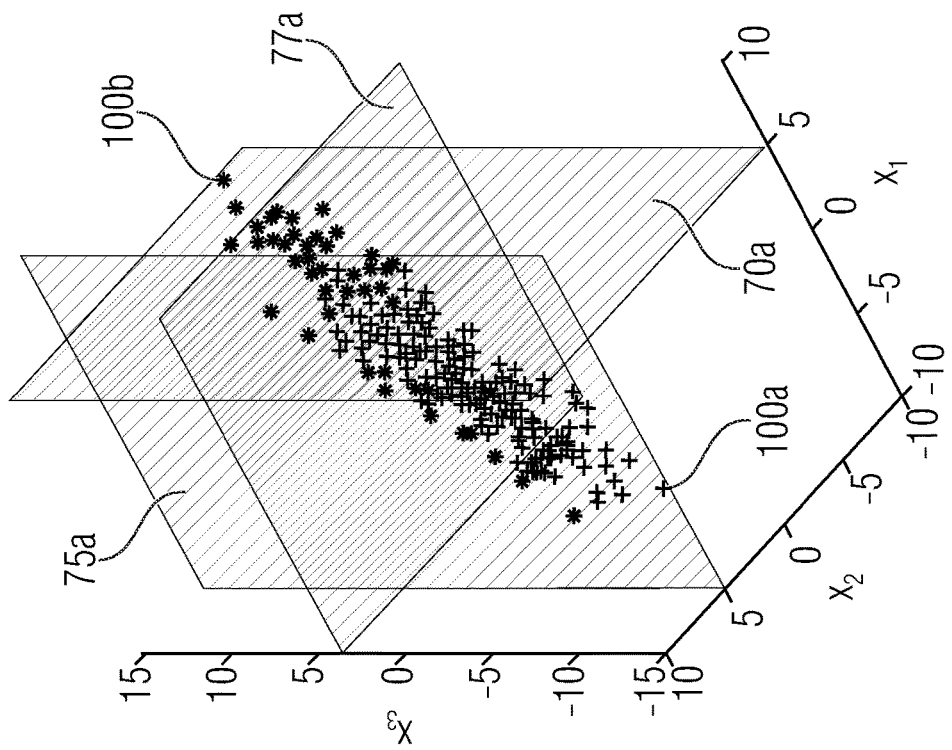
Fig. 6b
Fig. 6a

| $C_{Err}$ | $\tilde{\gamma}$ = pass | $\tilde{\gamma}$ = more test | $\tilde{\gamma}$ = fail |
|---|---|---|---|
| $\gamma$ = good | 0 | $C_M$ | $C_{YL}$ |
| $\gamma$ = bad | $C_E$ | $C_M$ | 0 |

Fig. 8

A schematic diagram of a bilinear basis function

A schematic diagram of a bilinear logistic function

Full test: $0.150 Test cost per device

Subset test: $0.077 Test cost per device:
$0.050 Test time
$0.011 Escapes (11ppm):
$0.016 Yield loss (1.55%)

Subset test with retest: $0.017 Test cost per device
$0.006 Subset test time
$0.003 More test time
$0.007 Escapes (7ppm)
$0.000 Yield Loss (0.05%)

|       | Fail    | More   | Pass    | All    |
| ----- | ------- | ------ | ------- | ------ |
| Good  | 0.046%  | 1.934% | 93.033% | 95.00% |
| Bad   | 4.954%  | 0.045% | 0.001%  | 5.00%  |
| All   | 5.000%  | 1.979% | 6.980%  | 13.96% |

Fig. 23

TESTER AND METHOD FOR TESTING A DEVICE UNDER TEST AND TESTER AND METHOD FOR DETERMINING A SINGLE DECISION FUNCTION

CROSS-REFERENCES TO RELATED APPLICATIONS

This application is a continuation of copending International Application No. PCT/EP2017/055368, filed Mar. 7, 2017, which is incorporated herein by reference in its entirety.

The present invention relates to a tester and a method for testing a device under test. Furthermore, a system comprising the tester and a method for using the system is shown. In other words, the present invention shows a cost-driven classification.

BACKGROUND OF THE INVENTION

Embodiments show a cost-driven quality improvement and test cost reduction of devices with multiple parametric measurements, such as mixed-signal or RF (radio frequency) devices, by exploiting correlations between measurements in order to minimize overall test cost, comprising cost of escapes, cost of yield loss and test time cost.

Optimal feature selection is an intractable problem for a large number of features (measurements). Enumeration of all $2^M$ test subsets is (nowadays) clearly Impractical for large M. Task-specific heuristics may be applied.

Known classification algorithms (aka discriminant analysis) include
  (Binary) decision trees
  Neural networks (NN)
  Support vector machines (SVM)
  Nearest neighbor
  Logistic regression None of these methods allows reflecting different cost of misclassifications (escapes vs yield loss).

In the industrial practice, pass/fail decisions may be based on comparisons of specification measurements to individual specification limits e.g. to estimate measurements that were not be performed on the device under test using measurements that have been performed on the device under test. Correlations between measurements are Ignored. Sensor data is not used for pass/fail decisions, although available with almost zero test time overhead. This Is Inefficient and time consuming. Furthermore, current test research does not quantify the cost impact of test selection.

Therefore, there is a need for an improved approach.

SUMMARY

An embodiment may have an apparatus for determining a single decision function $[\tilde{d}(\tilde{x})]$, wherein the apparatus is configured to obtain measurements [x] from a plurality of devices under test corresponding to stimulating signals applied to the plurality of devices under test, wherein the stimulating signals correspond to a set of tests performed on the plurality [N] of devices under test, wherein the apparatus is configured to determine a subset of tests from the set of tests, such that the subset of tests is relevant for indicating whether the plurality of devices under test pass the set of tests; wherein the apparatus is further configured to determine the single decision function applicable to measurements from an additional device under test tested using the subset of tests, such that the single decision function is adapted to predict a test result $[\tilde{\gamma}(\tilde{x})]$ for the set of tests on the basis of the subset of tests.

According to another embodiment, a tester for testing a device under test may have: a stimulating device configured to apply stimulating signals according to a subset $[\tilde{K}]$ of a set of tests $[\kappa]$ to the device under test; a signal processor configured to obtain measurements $[\tilde{x}]$ from the device under test corresponding to the stimulating signals and to decide, based on a single decision function $[\tilde{d}(\tilde{x})]$ applied to the measurements, whether the device under test is expected to pass the set of tests, wherein the single decision function is adapted to predict a test result $[\tilde{\gamma}(\tilde{x})]$ for the set of tests on the basis of the subset of tests $[\tilde{K}]$.

According to another embodiment, a test system for testing a device under test may have: an inventive apparatus to determine a single decision function; an inventive tester to determine, based on the single decision function, whether the device under test passes the testing.

According to another embodiment, a method for testing a device under test may have the steps of: applying stimulating signals according to a subset $[\tilde{K}]$ of a set of tests [K] to the device under test; obtaining measurements $[\tilde{x}]$ from the device under test corresponding to the stimulating signals and decide, based on a single decision function $[\tilde{d}(\tilde{x})]$ applied to the measurements, whether the device under test is expected to pass the set of tests; wherein the single decision function is adapted to predict a test result $[\tilde{\gamma}(\tilde{x})]$ for the set of tests on the basis of the subset of tests $[\tilde{K}]$.

According to another embodiment, a method for determining a single decision function $[\tilde{d}(\tilde{x})]$ may have the steps of obtaining measurements [x] from a plurality of devices under test corresponding to stimulating signals applied to the plurality of devices under test, wherein the stimulating signals correspond to a set of tests performed on the plurality [N] of devices under test, determining a subset of tests from the set of tests, such that the subset of tests is relevant for indicating whether the plurality of devices under test pass the set of tests; determining the single decision function applicable to measurements from an additional device under test tested using the subset of tests, such that the single decision function is adapted to predict a test result $[\tilde{\gamma}(\tilde{x})]$ for the set of tests on the basis of the subset of tests.

According to another embodiment, a method for testing a device under test may have the steps of: determining a single decision function according to the method for testing a device under test; determining, based on the single decision function, whether the device under test passes the testing according to the method for determining a single decision function $[\tilde{d}(\tilde{x})]$.

According to another embodiment, a non-transitory digital storage medium may have a computer program stored thereon to perform the inventive methods when said computer program is run by a computer.

Embodiments relate to an apparatus for determining a single decision function $[\tilde{d}(\tilde{x})]$. The apparatus is configured to obtain measurements [x] from a plurality of devices under test corresponding to stimulating signals applied to the plurality of devices under test. The stimulating signals correspond to a set of tests performed on the plurality [N] of devices under test. The apparatus may further determine a subset of tests from the set of tests, such that the subset of tests is relevant for indicating whether the plurality of devices under test pass the set of tests. The apparatus may also determine the single decision function applicable to measurements from an additional device under test tested using the subset of tests, such that the single decision function is adapted to predict a test result [$\tilde{\gamma}(\tilde{x})$] for the set of tests on the basis of the subset of tests.

The present disclosure is based on the finding that it is easier to train and to estimate decision thresholds along a single decision variable than predicting multiple decision functions. When predicting multiple decision functions, e.g. If a few tests are performed on the device under test and the remaining tests are estimated based on the few tests, it is more likely that the estimation of the remaining tests (which Is usually more than one) is more inaccurate than the training of one decision function. This is comprehensible since the estimation of the remaining tests uses the few tests to estimate multiple results (the remaining tests) where it is more likely that misclassifications occur when compared to an estimation of the single (only one) decision function based on the few tests. In other words, one pass/fail decision is estimated instead of multiple pass/fail decisions. When estimating the multiple results, specification (also abbreviated by "spec") limits for the remaining tests are known and, using the few tests, an estimation is performed whether the tested device under test falls within the specification limits of the remaining tests using only the few tests. Furthermore, using the single decision function, it is possible to take correlations between the tests into account that lead to an improved classification result (or enable using less tests for classification). This is not possible or at least more difficult when estimating multiple remaining tests.

According to embodiments, the single decision function may be smooth and/or scalar. A smooth scalar decision single variable is further able to express, in contrast to e.g. a Boolean variable, various degrees of goodness. Thus, the devices under test may, when using the same subset of tests, be assigned a specific value (or a score). This specific value, when compared between multiple devices under test, may enable a ranking of the devices under test In terms of their goodness, e.g. those devices under test having the highest specific value have the highest probability to be good. The decision whether a device under test passes the set of tests or fails to pass the set of tests is independent from determining the specific value of the device under test and may be performed by applying a decision threshold at a certain value of the decision function (i.e. a certain specific value), indicating that devices under test below that decision threshold fail to pass the set of tests and devices under test above the decision threshold pass the set of tests. Thus, the decision function itself may be used universally wherein it is possible to retrain or readjust the decision thresholds separately from the decision function if it is detected that too many wrong decisions are taken.

According to embodiments, the apparatus is configured to determine a decision threshold applicable to the single decision function using a distribution of a subset of the plurality of devices under test along the decision variable indicating, when applying the measurements of the plurality of devices under test related to the subset of tests to the single decision function, to pass the set of tests. The threshold at the single decision function indicates whether the device under test passes the set of test or fails to pass the set of tests. Thus, a tested device under test may be classified using the decision function.

According to embodiments, the apparatus is configured to determine a further decision threshold applicable to the single decision function using a distribution of the subset of the plurality of devices under test along the decision variable indicating, when applying the measurements of the plurality of devices under test related to the subset of tests to the single decision function, to fail passing the set of tests. The decision threshold is set to a different position of the decision function than the further decision threshold to obtain three areas indicating whether the additional device under test passes the test, fails to pass the test, or whether a further test is to be performed to decide whether the additional device under test passes the test or fails to pass the test. However, the decision threshold may be at a different position when compared to the previous embodiment. Thus, besides the actual classification result, it is also possible to define an area where it is mathematically and/or economically advantageous to perform a further test instead of providing the actual classification result.

According to embodiments, the apparatus may determine a further test from the set of tests and to add the further test to the subset of tests to form an extended subset of tests with an increased relevance for indicating whether the plurality of devices under test pass the set of tests. The apparatus may determine a further single decision function applicable to measurements from the additional device under test tested using the extended subset of tests, such that the further single decision function is adapted to predict the test result for the set of tests on the basis of the extended subset of tests. Thus, for some devices under test, the subset of tests may not be sufficient to decide whether the tested device under test passes or fails to pass the set of tests. Thus, a greater number of Incorrectly classified devices under test may be omitted by performing a further test.

According to embodiments, the apparatus is configured to determine unusual combinations of the measurements corresponding to the stimulating signals of the subset of tests applied to the plurality of devices under test and to determine the single decision function such that, if the single decision function is applied to measurements of the additional device under test using the subset of tests, the single decision function is adapted to provide the test result indicating that the additional device under test fails to pass the set of tests. Thus, unusual combinations of measurements may be an Indication that the tested device under test is bad and should therefore not pass the set of tests, even though the tested device under test fails within all specification limits of the subset of tests.

According to embodiments, the apparatus is configured to form an ideal decision function using a quality metric and to fit the single decision function to the ideal decision function such that, if the single decision function is applied to a combination of the measurements, a quality measure is obtained indicating whether the combination of the measurements contributes to identifying whether the device under test passes the test. The quality metric is one option to provide a measure for the specific value as described earlier as to reflect the relevance of a test to identify good or bad devices based on an analysis/training using multiple devices under test. Optionally, the apparatus is configured to use e.g. a Mahalanobis distance as the quality metric as to penalize unusual combinations of measurements indicating that the respective device under test revealing such an unusual combination of measurements fails to pass the test.

According to embodiments, the apparatus is configured to apply a compression function to the quality metric such that a curve shape of the single decision function around a decision threshold dividing areas of the single decision function indicating a device under test to pass the tests and an area of the single decision function indicating a device under test failing to pass the tests is emphasized. Using the compression function, the decision function varies most around a decision threshold. Thus, during fitting of the set of basis functions to an ideal decision function as a fitting target, a partial curve fitting in the region where the decision function is steep is sufficient. A complete curve fitting Is not necessary since the remaining regions provide a unique result independent from the fitting accuracy. According to embodiments the apparatus is configured to determine the single decision function using a set of basis functions reflecting the set of tests and by fitting the set of basis functions to an ideal decision function using a least absolute shrinkage and selection operator (LASSO) to determine the single decision function and to determine the subset of tests. Using LASSO regression, the steps of subset selection and curve fitting may be performed during one operation, i.e. both results are output of the LASSO regression. Thus, a pre-selection of tests, i.e. further calculations/operations, in advance can be omitted.

Furthermore, the apparatus is optionally configured to adapt the least absolute shrinkage and selection operator as to determine a further test and a further decision function, wherein the further decision function is applicable to measurements from an additional device under test tested using the subset of tests extended by the further test, such that the further single decision function is adapted to predict a test result $[\tilde{\gamma}(\tilde{x})]$ for the set of tests on the basis of the subset of tests extended by the further test. Thus, by adapting one operator of the LASSO regression, multiple pairs of decision functions and corresponding subsets of tests may be obtained. These pairs are further ranked according to their significance for classification.

According to embodiments, the apparatus is configured to perform the fitting by optimizing the loss function reflecting the costs for misclassification of a device under test and the costs to perform a further test on the device under test. Thus, using the costs, i.e. monetary costs for misclassification and monetary costs for further tests provide an economically relevant measure instead of only a technical measure to determine how to classify a device under test.

Embodiments further show a tester using the single decision function. The tester for testing a device under test comprises a stimulating device and a signal processor. The stimulating device may be configured to apply stimulating signals according to a subset $[\tilde{K}]$ of a set of tests $[K]$ to the device under test. The signal processor may be configured to obtain measurements $[\tilde{x}]$ from the device under test corresponding to the stimulating signals and to decide, based on a single decision function $[\tilde{d}(\tilde{x})]$ applied to the measurements, whether the device under test is expected to pass the set of tests. The single decision function may be further adapted to predict a test result $[\tilde{\gamma}(\tilde{x})]$ for the set of tests on the basis of the subset of tests $[\tilde{K}]$. Thus, the tester uses the classification method using the single decision function to obtain an improved classification result as described with respect to the embodiments of the apparatus determining the single decision function.

Embodiments show the stimulating device being configured to apply a further stimulating signal according to a further test of the set of tests to the device under test if the decision function reveals an ambiguous result indicating that the further test should be performed on the device under test as to decide whether the device under test passes the set of tests, wherein the subset of tests and the further test form an extended subset of tests. The signal processor may be further configured to obtain a further measurement from the device under test corresponding to the further stimulating signal and to decide, based on a further single decision function applied to the measurements and the further measurement, whether the device under test is expected to pass the set of tests, wherein the further single decision function is adapted to predict a test result for the set of tests on the basis of the extended subset of tests. Thus, the single decision function may indicate, besides the actual classification result, that it is mathematically and/or economically advantageous to perform a further test instead of providing the actual classification result.

Embodiments further show a test system for testing a device under test, the test system comprising the apparatus to determine a single decision function and the tester to determine, based on the single decision function, whether the device under test passes the testing.

Embodiments further show a method for testing a device under test, the method comprising the following steps: applying stimulating signals according to a subset $[\tilde{K}]$ of a set of tests $[K]$ to the device under test; obtaining measurements $[\tilde{x}]$ from the device under test corresponding to the stimulating signals and decide, based on a single decision function $[\tilde{d}(\tilde{x})]$ applied to the measurements, whether the device under test is expected to pass the set of tests, wherein the single decision function is adapted to predict a test result $[\tilde{\gamma}(\tilde{x})]$ for the set of tests on the basis of the subset of tests $[\tilde{K}]$.

Embodiments further show a method for determining a single decision function $[\tilde{d}(\tilde{x})]$ comprising the following steps: obtaining measurements $[x]$ from a plurality of devices under test corresponding to stimulating signals applied to the plurality of devices under test, wherein the stimulating signals correspond to a set of tests performed on the plurality $[N]$ of devices under test; determining a subset of tests from the set of tests, such that the subset of tests is relevant for indicating whether the plurality of devices under test pass the set of tests; determining the single decision function applicable to measurements from an additional device under test tested using the subset of tests, such that the single decision function is adapted to predict a test result $[\tilde{\gamma}(\tilde{x})]$ for the set of tests on the basis of the subset of tests.

Embodiments further show a method for testing a device under test, the method comprising the following steps: determining a single decision function and determining, based on the single decision function, whether the device under test passes the testing.

Embodiments further show a computer program for performing, when running on a computer, one of the methods.

BRIEF DESCRIPTION OF THE DRAWINGS

Embodiments of the present invention will be detailed subsequently referring to the appended drawings, in which:

FIG. 1 shows a schematic block diagram of a tester testing a device under test;

FIG. 2 shows a schematic block diagram of an apparatus for determining a single decision function;

FIG. 5a shows a full test using both measurements 1 and 2;

FIG. 5b shows a magnification of the area of FIG. 4a that indicates the threshold between the area of a device passing the test and the area of a device failing the test;

FIG. 5c shows a schematic diagram with a reduced test or a subset test using one of the two measurements;

FIG. 6a shows a schematic 3-dimensional (3D) scatter plot indicating a simplistic example with 3 measurements $x_1$, $x_2$, $x_3$, with upper specification limits $\tilde{x}_1=5$, $\tilde{x}_2=5$, and $\tilde{x}_3=3.5$;

FIG. 6b shows a projection of the 3D scatter plot into the $(x_1, x_2)$-plane;

FIG. 8 shows a table indicating the cost of classification error per decision;

FIG. 23 shows an exemplary result report.

DETAILED DESCRIPTION OF THE INVENTION

Figure 3A:
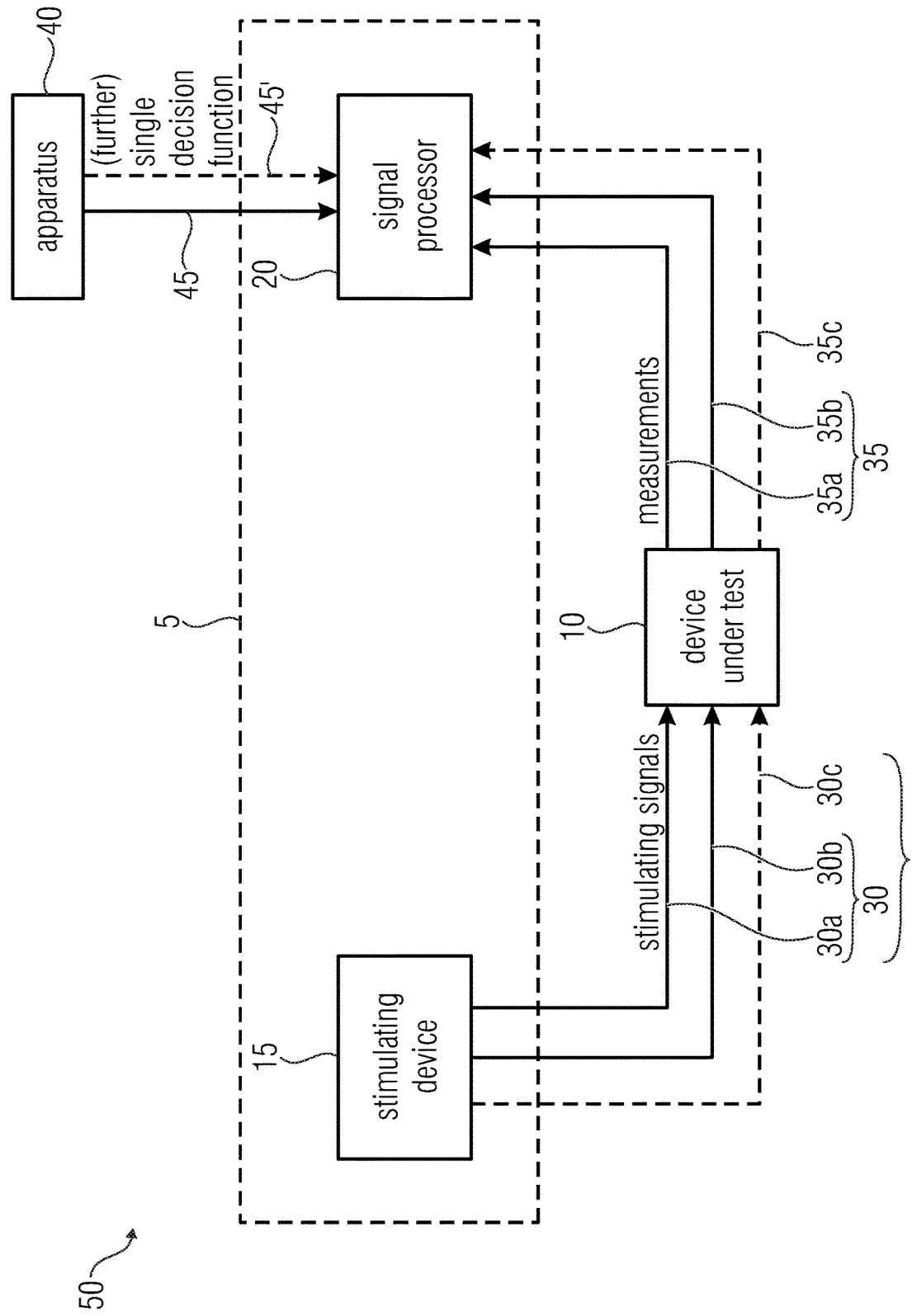
FIG. 3a shows a schematic block diagram of a test system comprising the apparatus and the tester.

In the following, embodiments of the Invention will be described in further detail. Elements shown in the respective figures having the same or a similar functionality will have associated therewith the same reference signs.

FIG. 1 shows a schematic block diagram of a tester 5 for testing a device under test 10. The tester 5 comprises a stimulating device 15 and a signal processor 20. The stimulating device is configured to apply stimulating signals 30, 30a, 30b according to a subset of a set of tests to the device under test 10. The signal processor 20 is configured to obtain measurements 35, 35a, 35b from the device under test corresponding to the stimulating signals 30 and to decide, based on a single decision function applied to the measurements, whether the device under test is expected to pass the set of tests. The single decision function is adapted to predict a test result for the set of tests on the basis of the subset of tests. The test result may be a classification result whether the tested (e.g. the additional) device under test passes the set of tests, fails to pass the set of tests, or optionally whether more test should be performed to decide whether the device under test passes the tests or fails to pass the tests.

The stimulating device may be any (electric or electronic) signal former such as a function (or signal) generator, a sine generator, a noise generator, etc. forming the stimulating signal. The stimulating may be fed (i.e. applied or provided) directly to the device under test as an input signal e.g. to simulate operating conditions. Additionally or alternatively, the stimulating signal may be fed indirectly to the device under test e.g. by providing the stimulating signal to a temperature control as to adapt the temperature of the environment of the device under test or to generate interference signals as to test the electromagnetic compatibility. From an alternative perspective, the temperature or the electromagnetic compatibility as examples for stimulating signals being indirectly fed to the device under test may itself be referred to as stimulating signals.

The measurements may be measured (i.e. obtained) at the device under test after and/or during application of the stimulating signals to the device under test. Thus, the measurements correspond to the stimulating signals. The measurements may be voltages or currents measured at/through (components of) the device under test. Furthermore, one test may cause one or more measurements. In other words, one or more measurement may refer to one test of the set of tests. The number of measurements corresponding to a test be predefined in that the same measurements are measured any time the test is performed. The measurement 35a, indicated by one line, may represent the one or more measurements corresponding to the one or more stimulating signals 30a, also indicated for the sake of simplicity only by one line. The same applies to the other stimulating signals and measurements.

One test of the set of tests may be specified by one or more stimulating signals to be applied to the device under test during the test causing a respective measurement at the device under test. The stimulating signals may be continuous such as comprising e.g. sine or rectangular shaped or having a constant signal course. Additionally or alternatively, the stimulating signals may be discontinuous such as comprising one or more dirac pulses or being phase angle-controlled, etc. The tests may further comprise a specific sequence of stimulating signals to be (sequentially) applied to the device under test. The set of tests may comprise a plurality of these tests that may be performed on the device under test.

Thus, the set of tests may comprise those tests that may be (reasonably) performed on the device under test to decide whether the device under test is fulfil the requirements or fail to fulfil the requirements (i.e. pass or fail the tests, are within or off specification), also referred to as a full test. The subset of tests may be a true subset, i.e. comprises a selection of tests from the set of tests that comprises fewer tests than the set of tests. Following will be referred to an extended set of tests that is also a selection of tests form the set of tests comprising more tests that the subset of tests but advantageously fewer tests that the set of tests. However, in some cases, the optimal solution e.g. in terms of costs, may be to perform each test of the set of tests. In this case, the extended set of tests comprises all tests of the set of tests. Nonetheless, performing all tests on the device is typically more expensive than sorting a device under test out if a clear pass decision cannot be performed with a true subset of tests.

The single decision function may comprise one input variable corresponding to one of the measurements. Thus, the single decision function may be referred to as being multidimensional In that each measurement (i.e. each input variable) refers to one dimension. In other words, a value corresponding to the measurement such as a mean value or a maximum/minimum amplitude of the response value, or if the response value is a discrete value, the measured current/voltage/binary value (measurement) is inserted into the single decision function. Based on the result of the single decision function, the signal processor may decide (i.e. predict, estimate) whether the device under test is expected to pass the set of tests. In other words, the single decision function may predict a pass/fail decision from the subset of tests corresponding to a pass/fail decision that would have been made if having performed all tests of the set of tests. Thus, the single decision function may map a pass/fail decision to be made using the set of tests into a lower-dimensional representation spanned by the (extended) subset of tests. In further other words, the single decision function is adapted to predict a test result for the set of tests on the basis of the subset of tests.

The output of the decision function may be binary or comprises one threshold forming two areas indicating whether the current device under test (e.g. the additional device under test introduced below) passes the set of tests or falls the set of tests (corresponding to whether the device under test fulfills or fails to fulfil the respective requirements). According to embodiments, the output of the decision function comprises two thresholds forming three areas indicating whether the current device under test passes the set of tests, falls to pass the tests, or whether one or more further tests should be performed to decide whether the device under tests passes or fails the set of tests. Behind the single decision function may be a cost function indicating which decision is favorable in view of the costs and the respective probability that the decision is wrong.

According to embodiments, the stimulating device may apply an optional further (or multiple further) stimulating signal 30c according to a further test of the set of tests to the device under test 10 if the decision function reveals an ambiguous result. The ambiguous result may indicate that the further test should be performed on the device under test as to decide whether the device under test passes the set of tests, wherein the subset of tests and the further test form the extended subset of tests 30. The signal processor may obtain an optional further measurement 35c from the device under test corresponding to the further stimulating signal and to decide, based on a further single decision function applied to the measurements 35 and the further measurement 35c, whether the device under test is expected to pass the set of tests. The further single decision function may comprise Input variables suitable to have inserted the measurements 35 and the further measurements 35c as already described with respect to the single decision function. Thus, the further single decision function may be adapted to predict a test result for the set of tests on the basis of the extended subset of tests. In other words, the tester may perform more tests If the single decision function indicates that more tests should be performed. This may be an iterative process until the respective single decision function suitable for the performed (subset of) tests indicates a pass/fail decision instead of performing a further test.

Figure 3B:
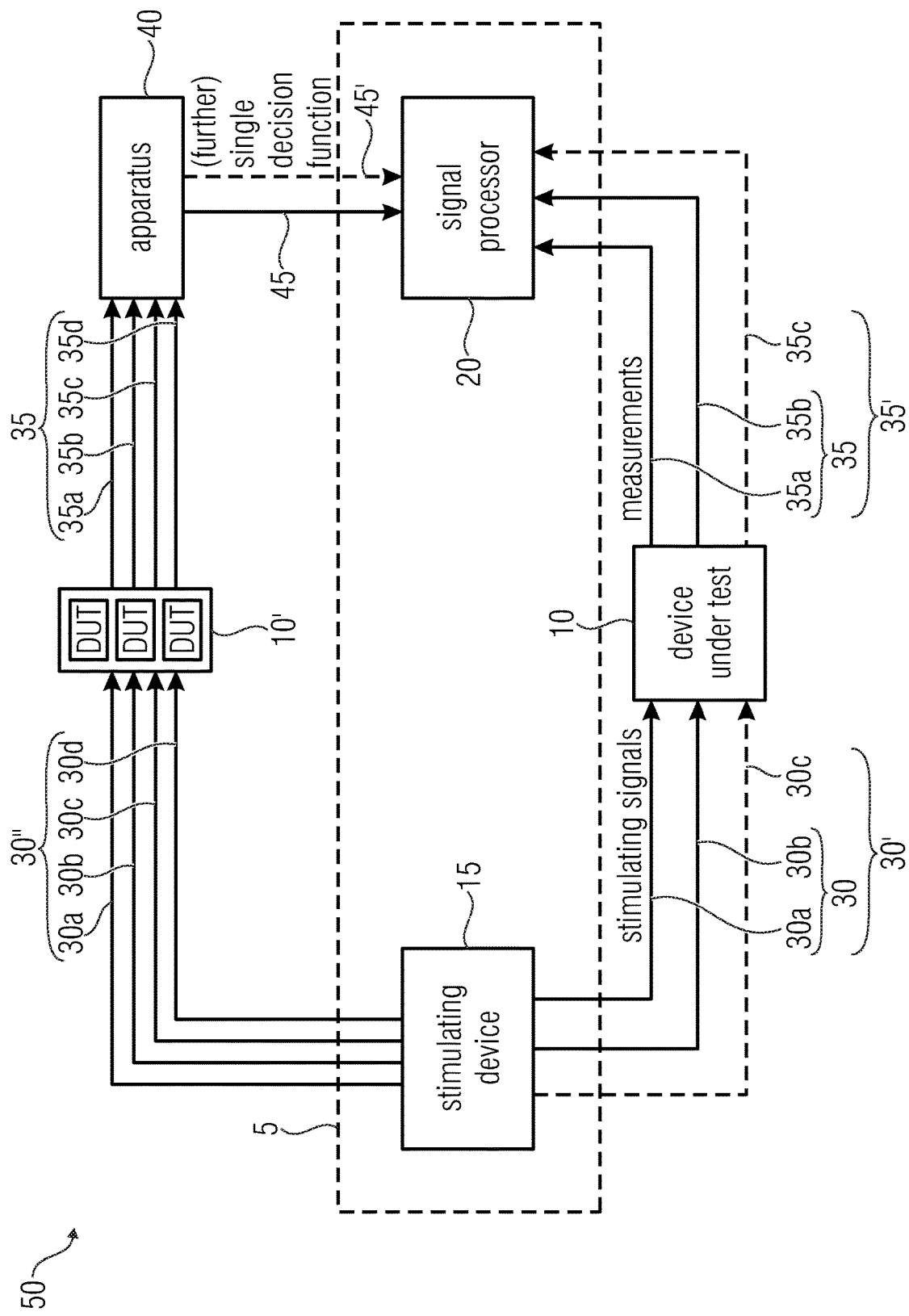
FIG. 3b shows a schematic block diagram of a test system comprising the apparatus and the tester according to an embodiment.

FIG. 2 and partially FIG. 3b show an apparatus 40 for determining a single decision function 45. The apparatus 40 may obtain measurements 35 (35a-d) from a plurality of devices under test 10' corresponding to stimulating signals 30'' applied to the plurality of devices under test. The stimulating signals 30'' correspond to the set of tests performed on the plurality of devices under test 10'. The apparatus may further determine a subset of tests from the set of tests, such that the subset of tests is relevant for indicating whether the plurality of devices under test pass the set of tests. In other words, the set of tests is (completely) performed on multiple devices under test to obtain (or collect) a measurement ideally for each test of the set of tests. From the collected measurements, the apparatus may determine the subset of tests that provide valuable information regarding a pass/fail decision of the devices under test. Using this subset of tests, the apparatus may determine the single decision function applicable to measurements from an additional device under test tested, such that the single decision function is adapted to predict a test result for the set of tests on the basis of the subset of tests.

The set of tests may be performed on each device under test of the plurality 10' of devices under test by applying the stimulating signals 30'' sequentially to each device under test, i.e. the devices under test may be tested sequentially with all tests of the set of tests or the tests may be kept constant while each device under test of the plurality of devices under test is tested using the same test and the tests run sequentially. The determination of the single decision function refers to using the single decision function as described with respect to the tester of FIG. 1.

According to embodiments, the apparatus 50 is configured to determine a further test from the set of tests and to add the further test to the subset of tests to form an extended subset of tests with an Increased relevance for indicating whether the plurality of devices under test pass the test. The apparatus may determine a further single decision function applicable to measurements from the additional device under test tested using the extended subset of tests, such that the further single decision function is adapted to predict a test result for the set of tests on the basis of the extended subset of tests. This embodiment for determining the further single decision function corresponds to the embodiment using the further single decision function described with respect to FIG. 1.

FIG. 3a shows a schematic block diagram of a test system 50 for testing a device under test. The test system comprises the apparatus 40 to determine the single decision function (and optionally one or more further single decision functions) and the tester 5 to determine, based on the single decision function (and optionally the one or more further single decision functions) whether the device under test passes the testing (i.e. passes the set of tests). Thus, the signal processor may use the single decision function 45 and optionally the further decision function 45' to determine whether the currently tested device under test 10 passes or fails the (full) set of tests.

FIG. 3b shows a schematic block diagram of the test system 50 Indicating that the tester for testing a current device under test 10 may also be used to perform the actual determination of the single decision function using the apparatus 40. Therefore, the upper part of FIG. 3b runs during determination of the single decision function wherein the lower part of FIG. 3b runs during testing an actual device under test using the single decision function.

The proposed tester, test system or method may target devices or methods with many parametric production measurements. Examples are RF, analog, mixed-signal, power managements, and HSIO devices. All circuit behavior depends on the design, a few dozens of process parameters, and potential random defects. Since production test often conducts 100s or even 1000s of measurements per device, measurements tend to be highly correlated. Literature reports good but not ideal correlation even between simple substitute tests and specification tests. Better but still not ideal correlation can be expected between specification tests. Embodiments show the usage of this correlation. Pass/fail decisions are not made based on Individual specification limits, independently for each measurement. It is well known that correlations can be exploited to (1) increase quality (outlier testing) and (2) to remove redundant tests. For both purposes, sensor measurements can provide additional information at almost no test time increase. Both goals can be balanced in a test cost goal that combines the cost of escapes (quality) and the cost of test execution.

Increase Quality

Figure 4:
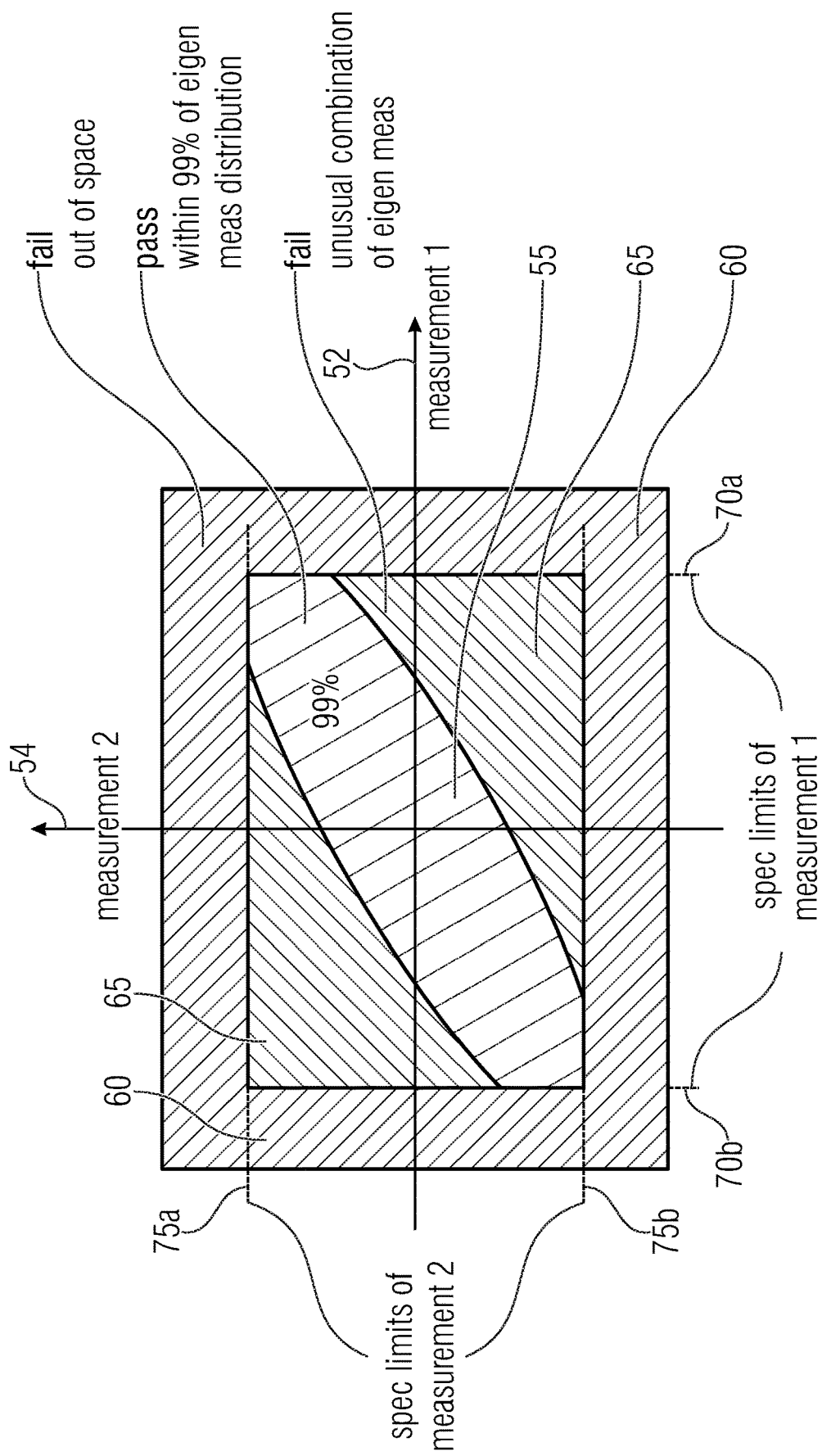
FIG. 4 shows a schematic diagram presenting areas of a scatter plot, where measurement combinations indicate a device under test to pass or to fail the test.

FIG. 4 shows a schematic diagram highlighting areas as a result of a distribution of pass/fail decisions, e.g. obtained from a scatter plot, where the distribution of results of two measurements (subset of tests) indicate a device under test to pass or to fail the test. The first measurement (measurement 1) is plotted on the horizontal axis 52 and the second measurement (measurement 2) is plotted on the vertical axis 54. A first area 55 indicates devices that pass the set of tests, e.g. since the device under test falls within an ellipsoid representing 99% of all measurements which may be referred to as eigen measurement distribution. Other definitions such as e.g. another percentage of the eigen measurement distribution, e.g. an eigen measurement distribution greater than 98%, greater than 99%, or greater than 99.9% or another measure different from the eigen measurement distribution may also be considered. A second area 60 Indicates a device under test that fail the set of tests (and also falls to pass the subset of tests) since it is out of specification, i.e. it does not comply with the requirements. A third area 65 indicates devices under test that fail the set of tests due to an unusual combination of eigen measurement. In this case, a device under test would pass the subset of tests but it is likely that one or more of the further tests would be failed.

First and second thresholds 70a,b and 75a,b indicate the specification limits of measurement 1 and measurement 2, respectively. The underlying assumption is that unusual measurement combinations identify a bad device (indicated in the second area 65), although all measurements may be within specification limits. Thus, an unusual measurement combination may indicate that, even though a device under test passes all tests of the subset of tests, one or more of the further tests would be failed to pass. Parts (i.e. measurements from devices under test falling) in this area 65 are most likely bad outlier parts that escape simple comparison against individual specification limits. This is known as outlier detection. Particularly random defects may be detected from unusual measurement combinations. In other words, the apparatus may determine unusual combinations of the measurements corresponding to the stimulating signals of the subset of tests applied to the plurality of devices under test. Furthermore, the apparatus may determine the single decision function such that, if the single decision function is applied to measurements of the additional device under test using the subset of tests, the single decision function is adapted to provide a test result indicating that the additional device under test fails to pass the set of tests. A measure of an unusual combination may be the eigen measurement distribution described above or the mahalanobis distance. This single decision function may be used in the tester 5. Furthermore, the same applies to the further single decision function accordingly.

Reduce Test List

A reduced test list (i.e. subset of tests) reduces the cost of test execution. On the other side, classification based on a subset of measurements (i.e. subset of tests) Invariably leads to classification errors, namely escapes and yield loss that incur additional cost. FIGS. 5a-c show this relation. FIGS. 5a,b indicate a full test using both measurements 1 and 2, wherein FIG. 5b is a magnification of the area of FIG. 5a that indicates the threshold between the area 55 of a device passing the test and the area 60 of a device falling the test. FIG. 5c shows a schematic diagram with a subset of tests using one of the two measurements (i.e. set of tests). This results in a test limit 90, which may be a simple linear decision threshold, where the missing information of the second (missing) measurement leads to areas 80, 85 of misclassification, namely escapes 80, where devices under test pass the test even though they are "bad" and yield loss 85, where devices under test fail the test even though they are "good".

When correlations are high, particularly when many measurements (subset of tests) are available, a complex decision boundary in a multi-dimensional space (single decision function) of remaining measurements can achieve good classification accuracy. It should be noted that the terms decision boundary and decision threshold are mutually exchangeable and refer both to the thresholds separating the areas indicating the different classification results (e.g. good, bad, more test).

FIG. 6a shows a schematic 3-dimensional (3D) scatter plot indicating a simplistic example with 3 measurements $x_1$, $x_2$, $x_3$, with upper specification limits 70a, $\tilde{x}_1=5$. 75a, $\tilde{x}_2=5$, and 77a $\tilde{x}_3=3.5$. The distribution of correlated measurements has the shape of an ellipsoid. FIG. 6b shows a projection of the 3D scatter plot into the $(x_1,x_2)$-plane shows that separation can work quite well with measurements 1 and 2 only, but of course with some classification errors. The challenge is finding decision boundary between passing and failing devices that minimizes the number (or better cost) of classification errors. The situation is much more convincing in the case of more measurements, yet impossible to illustrate on paper.

Figure 7:
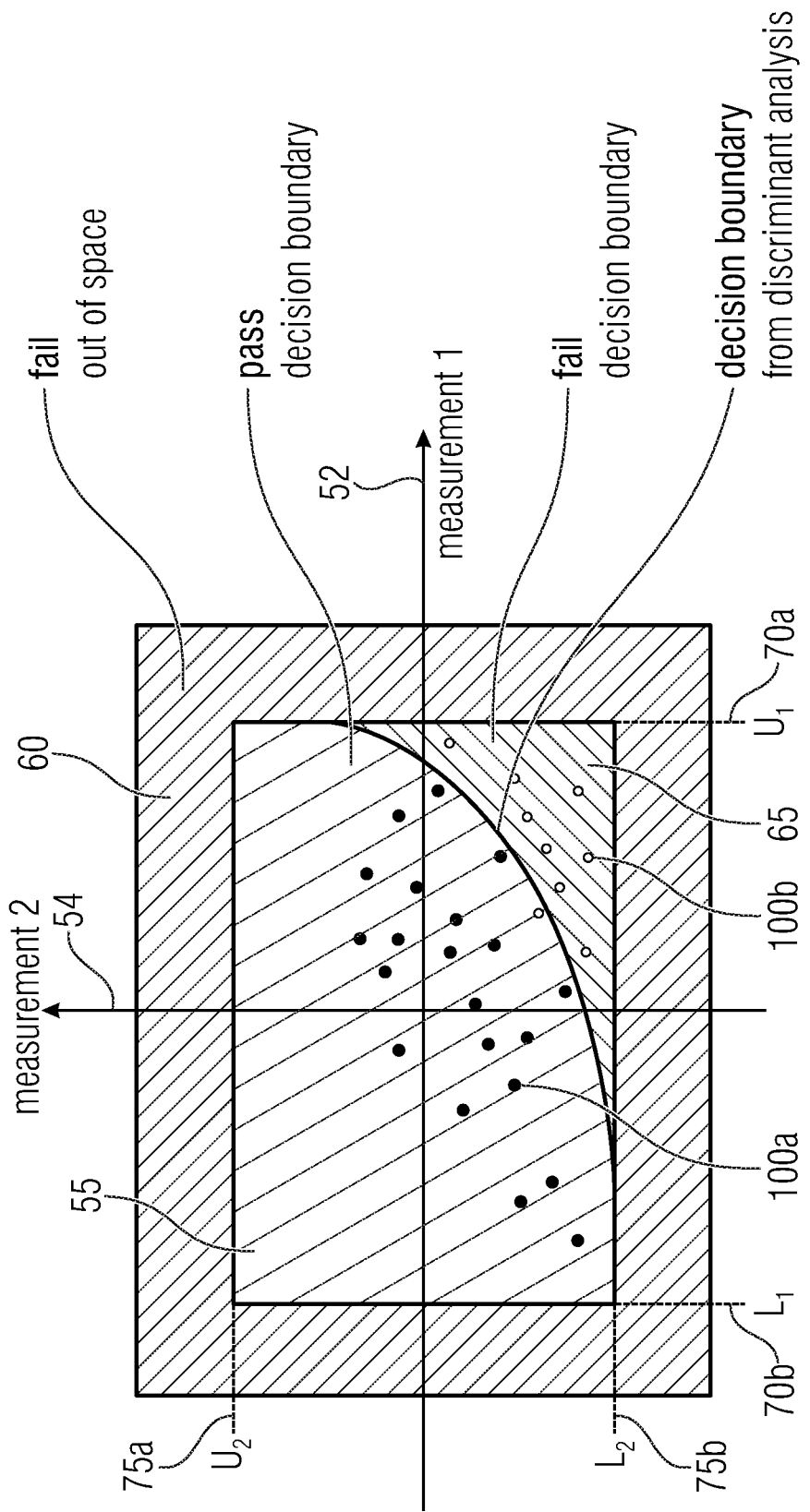
FIG. 7 shows a schematic diagram presenting areas of a scatter plot, where measurement combinations indicate a device under test to pass or to fail the test with a subset of measurements.

FIG. 7 shows a schematic diagram presenting areas of a scatter plot, where measurement combinations indicate a device under test to pass or to fail the set of tests with a subset of measurements. Herein, a decision boundary 67 is non-linear. The decision boundary 67 may indicate a threshold of devices under test passing the subset of tests (the devices under test are within the specification limit/comply with the requirements) but are expected to fall passing the set of tests. The decision boundary may be determined from discriminant analysis, simplified Indicating the border between areas of devices under test passing the set of tests (first area 55) and failing to pass the set of tests (third area 65). Markers 100a indicate a "good" device and markers 100b indicate a "bad" device.

Additionally, the second area 60 is shown indicating the devices under test that fail to pass the subset of tests (and therefore also the set of tests).

Options According to an Embodiment

According to embodiments, an option is to minimize overall cost, including cost of escapes (quality) and cost of test itself. Depending e.g. on the relative cost of escapes, cost of yield loss and cost of test time, this can lead to Improved quality or reduced test time cost, or both. An optimal test subtest shall be found along with a classification function that allows making a pass/fail decision based on this test subset. Optionally, uncertain (or ambiguous) cases that use more testing to make a reliable decision shall be identified.

Further Issues According to Embodiments

This task can be formulated as combination of a feature selection problem (subset of tests) and a classification problem with 2 classes (pass, fail) or optionally 3 classes (pass, fail, more test). It may belong to supervised learning, because the correct answer (whether the device under test is good (passes the set of tests) or bad (fails to pass the set of tests)) is known. Therefore, the further signal processor 47 may use supervised learning to calculate the decision function. From a machine learning point of view there may be several key challenges:

Extremely unbalanced class populations (very few bad devices), involving huge training sets (100 k~1 M)

Cost of misclassification is very different for escapes and yield loss

There can be 100s or even 1000s of features (measurements)

Although final classification has two classes (or optionally 3 classes), failing devices belong to many different distributions, because there are many different types of defects, and to a truncated version of the passing distribution, where specs are violated.

Fortunately the problem is typically 'dense', i.e. the training set is larger than the number of measurements.

Precise Problem Formulation According to an Embodiment

Baseline

The baseline may be a suite of K specification-based tests $k \in K = \{1, 2, \ldots, K\}$ with test times $T_k$ being run for all devices. The total baseline test cost with test cost rate $c_t$ is $$C = c_T T(K) = c_T \sum_{k \in K} T_k \qquad (1)$$

Each test returns one or multiple measurements according to the one or more stimulating signals as defined by the test, leading to a total of M measurements, $m \in M = \{1, 2, \ldots, M\}$. $M_x \subseteq M$ is the set of measurements returned in test k. Measurement values $x_m \in R$ are assumed to be normalized to zero bias and unit standard deviation, combined for each device into 1×M row vector x, with optional normalized lower and upper specification limits $\check{x}_m, \hat{x}_m$. It is possible that a measurement, e.g. a DFT (Design for Test) sensor measurement, has no specification limit but contributes valuable Information for calibration, which may contribute to determining outlier within the measurements. When all measurements (corresponding to the set of tests) are in spec, the device is classified as $\Gamma$=Good, otherwise $\Gamma$=Bad, i.e. the device passes the set of tests of fails to pass the set of tests.

Classification

The training set consists of a plurality of N devices under test, $n \in N = \{1 \ldots N\}$, with measurement values $X_m$ and correct pass/fail classifications $\gamma_n$. Combine N×M measurements into matrix x and pass/fail results into an N×1 classification vector $\gamma$. Because the intention is to benefit from test time reduction by eliminating tests, consider subset $\tilde{K} \subseteq K$ of tests with reduced test time $T(\tilde{K})$ and resulting subset of measurements $\tilde{M} \subseteq M$ with values $\tilde{x} = [X_m : m \in \tilde{M}]$. $\bar{K}$ denotes the eliminated tests, the eliminated measurements, and vector x the eliminated measurement values. Classification $[\tilde{\gamma}(\tilde{x})]$ relies on a decision function $\tilde{d}(\tilde{x})$ that has only access to the subset measurements $\hat{x}$ and uses decision limits $\tilde{d}_P, \tilde{d}_F$.

$$\tilde{\gamma}(\tilde{x}) = \begin{cases} \text{Fail} & \text{if} \quad \tilde{d}(\tilde{x}) < \tilde{d}_F \\ \text{MoreTest} & \text{if} \quad \tilde{d}_F \le \tilde{d}(\tilde{x}) < \tilde{d}_P \\ \text{Pass} & \text{if} \quad \tilde{d}_P < \tilde{d}(\tilde{x}) \end{cases}$$

Category 'MoreTest' can be chosen when the risk of a classification error is too high and it is more cost effective to run more tests (further test).

Test Cost

With reduced information from a reduced test set, classification errors can occur. The total test cost benefits from a reduced test time cost for the reduced test list $\tilde{K}$ but includes additional cost of classification errors.

$$\tilde{C} = \tilde{C}_T(\tilde{K}) + \tilde{C}_B(\tilde{\gamma}, \gamma)$$

Cost of test time for test subset $\tilde{K}$ is $$\tilde{C}_T(\tilde{K}) = c_T T(\tilde{K}) - c_T \sum_{k \in \bar{K}} T_k.$$

Cost of classification error $\hat{C}_{Eff}(\tilde{\gamma}, \gamma)$ is the aggregate cost of predicting classes $\tilde{\gamma}$ when the correct classes are $\gamma$. The table shown in FIG. 8 indicates the cost of classification error per decision.

Cost of misclassification has three contributors: cost of escapes, cost of yield loss, and test time cost for more test in uncertain cases.

$$\tilde{C}_{Err} = c_E p_E + c_{YL} p_{YL} + c_M p_M$$

Escape: Cost per test escape c, incur with probability of escape $p_E = p(\tilde{\gamma} = \text{Pass}, \gamma = \text{Bad})$. Yield loss: Cost per lost device $c_{YL}$ incur with probability of lost die $p_{YL} = p(\tilde{\gamma} = \text{Fail}, \gamma = \text{Good})$.

More test: In a multi-site environment, more test should be applied to all S sites together. When the probability of classifying 'More Test' for a single device is $p_M = p(\tilde{\gamma} = \text{More Test})$, the additional cost of testing all S with complete test time T as opposed to reduced test time $\tilde{T}$ is:

$$c_M = S \cdot c_T (T - \tilde{T})(1 - (1 - p_M)^S)$$

Instead of using the complete test list, an augmented test list could be used as well. Often, test cost per good device is used as figure of merit. However, this yields a non-linear function of yield, which makes the definition unsuitable for efficient optimization.

Optimization Problem

The total test cost consists of test time cost for the selected subset of tests $\tilde{K}$, and cost of classification errors, which depends on the decision function $\tilde{d}(\tilde{x})$ itself and its decision limits $\tilde{d}_P, \tilde{d}_F$.

$$\tilde{C}(\tilde{K}, \tilde{d}(.), \tilde{d}_P, \tilde{d}_F) = \tilde{C}_{Err}(\tilde{d}(.), \tilde{d}_P, \tilde{d}_F) + c_T T(\tilde{K})$$

The goal is to determine the best tuple of $\tilde{K}$, $\tilde{d}(\ )$, and $\tilde{d}_P, \tilde{d}_F$, which leads to lowest test cost.

$$(\hat{K}, \hat{d}(.), \hat{d}_P, \hat{d}_F) = \underset{\tilde{K}, \tilde{d}(.), \tilde{d}_P, \tilde{d}_F}{\operatorname{argmin}} \; C(\tilde{K}, \tilde{d}(.), \tilde{d}_P, \tilde{d}_F)$$

$$\hat{C} = \tilde{C}(\hat{K}, \hat{d}(.), \hat{d}_P, \hat{d}_F)$$

The achieved test cost reduction is $$\Delta C = C - \hat{C}.$$

In this form, the above optimization problem is practically unsolvable, because the search space is unmanageable, consisting of 100 . . . 1000 binary variables for selection or not-selection of tests, a variational problem (manageable problem) is to find decision function $\tilde{d}(\tilde{x})$ of a high dimensional measurement vector, and two decision thresholds $\hat{d}_P, \hat{d}_F$ with extremely non-linear influence on the optimization target.

Concept According to an Embodiment

Figure 9:
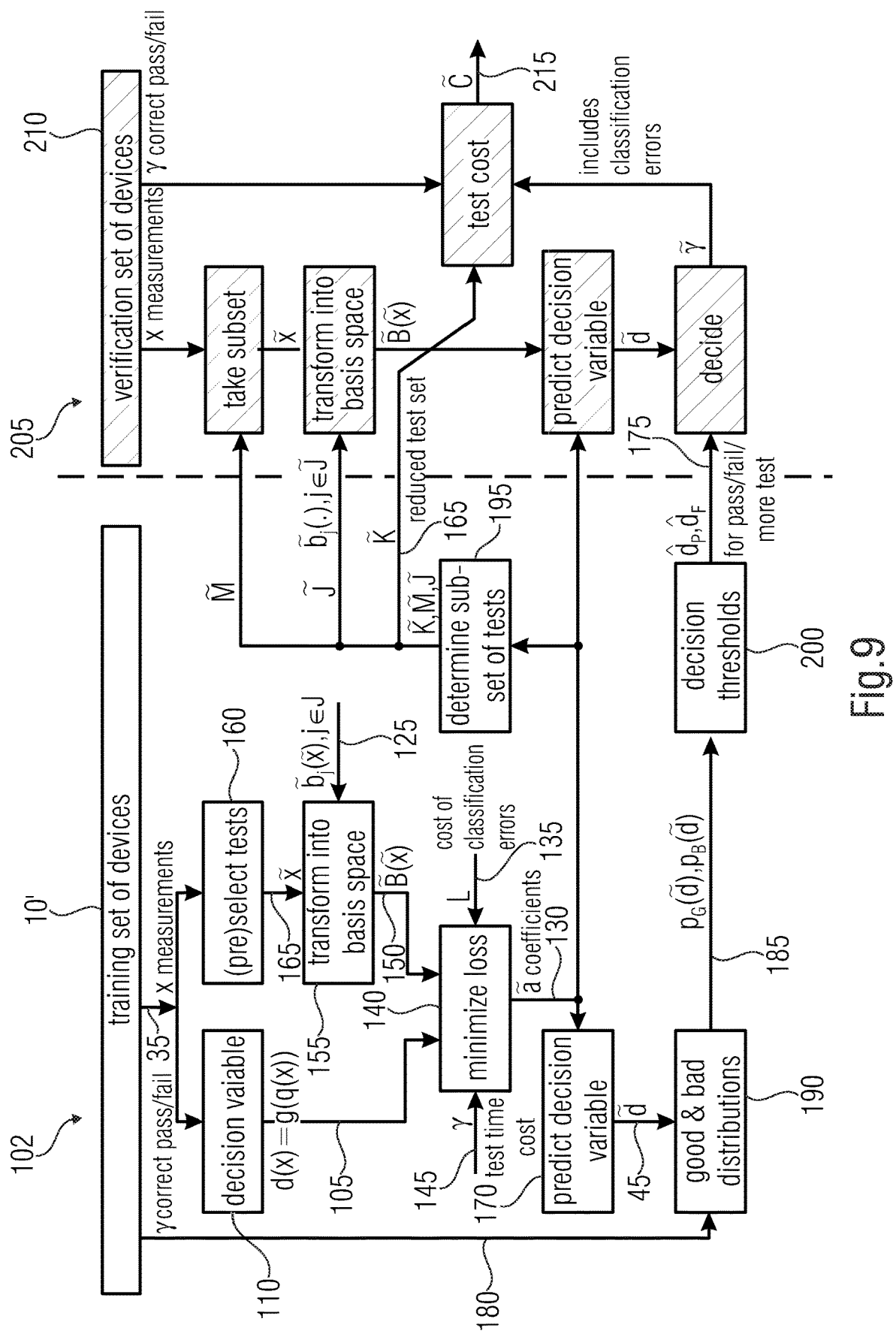
FIG. 9 shows a schematic block diagram of the concept according to an embodiment.

FIG. 9 shows a schematic block diagram of the concept for determining the single decision function according to embodiments. Thus, FIG. 9 shows an exemplary embodiment of the apparatus 40. However, embodiments also relate to implementations of only one or more blocks of FIG. 9.

FIG. 9 reveals a training path 102 on the left and a verification path 205 on the right. The following description refers to the determination of the single decision as shown in the training path 102. The verification path refers to verification/validation of the obtained single decision function, e.g. as to test whether the decision function is over-trained on the training set. An over-trained function may comprise decision boundaries that are closely fitted to the training data and therefore reveal difficulties in determining general areas/general decision boundaries in order to perform a suitable classifying on newly presented data. This section provides an overview on the determination of the decision function according to the steps shown in FIG. 9. The subsequent sections provide a detailed insight into each step/block.

In the training path 102. It may be defined, a smooth decision function d(x) 105 in block 110 (e.g. referred to as decision variable or decision function determiner) receiving from a training set of devices 10' (all tests from the set of tests applied to the plurality of devices under test) a measurement vector (measurements related to the set of tests)x 35. It should be noted that the term decision variable and the term decision function are mutually applicable throughout the application. The decision function 105 may reflect the full set of tests and approximates a generalized distance to the multi-dimensional decision boundary between good and bad devices and may be therefore referred to as ideal decision function. In contrast to a Boolean-valued function, it is smooth so that it allows to express various degrees of goodness to support outlier detection and also supports decision thresholds for more test when it is unclear whether the device shall pass or fail. To ensures that a later optional regression step optimizes its accuracy near the decision boundary and ignores subtle differences for clearly passing or clearly failing devices, d(x) may be designed to have a sigmoid shape that varies most around the multi-dimensional decision boundary and is almost constant elsewhere.

A block 160 (e.g. referred to as test pre-selector) may optionally (pre-) select the tests to use a reduced set of measurements $\tilde{x}$ 165 for further signal processing, which may be different from the subset of tests. To obtain a tractable optimization problem, cost optimization may be formulated as a quadratic optimization problem. The predicted single decision function $\tilde{d}(\tilde{x})$ 170 is a weighted sum of basis functions $\tilde{b}_j(\tilde{x})$ 125, which may be transformed into basis space vector $\tilde{B}(\tilde{x})$ 150 using block 155 (e.g. referred to as basis function determination unit), with weights $\tilde{a}_j$ that are combined to an unknown parameter vector $\tilde{a}$ 130. Cost of classification errors L 135 may be modeled as a weighted quadratic function of $\tilde{d} - d$ (i.e. the difference between the estimated single decision function and the ideal decision function) and thus of parameter vector $\tilde{a}$ 130, weighted to reflect the different cost of escapes and cost of lost devices. A block 140 (e.g. referred to as loss minimizing unit) may minimize the loss between the cost of classification errors 135 and the test time cost 145. Using the predicted decision function $\tilde{d}(\tilde{x})$ 45 from block 170 (e.g. referred to as decision variable prediction unit) and the correct pass/fail classification 180 of the training set of devices 10', probability functions $p_G(\tilde{d}), p_B(\tilde{d})$ 185 for good and bad devices may be calculated with block 190.

The overall optimization problem may be treated as a sequence of two problems: (1) Find test subset k 165 and parameter vector $\tilde{a}$ in decision function $\tilde{d}(\tilde{x})$ 170 e.g. using block 195, and (2) find decision thresholds $\hat{d}_P, \hat{d}_F$ 175 e.g in block 200 for pass/fail/more test decisions. Test subset selection (block 195) can be performed in two steps. First, explicit subset selection ranks tests based on various metrics, such as the number of tests that only fail this test, and preselects or excludes tests with very high or very low rank, described in the following chapter.

Second, implicit subset selection, performed in block 195, may be based on the observation that LASSO regression (Least Absolute Shrinkage and Selection Operator) minimizes a quadratic loss function, using the fewest possible basis terms. Because basis terms are intentionally constructed to depend on only one or very few tests, a few basis terms lead to few tests used, effectively performing test subset selection. The balance between cost of classification errors and cost of test time A (cf. block 140) may be set by a scalar Lagrange multiplier of an L1-regularization term that penalizes used basis terms. Weights are added to reflect the different test time cost contributions per test. This implicit subset selection is described in section "LASSO regression with subset selection according to an alternative embodiment of block 140".

However, the prediction of the decision variable in block 170 and the determination of the subsets of test in block 195 may be performed inherent in block 140.

Decision thresholds for pass, fail (and more test) may be determined as a last step. Based on cumulative distributions of good and bad devices in the training set along the decision variable, the cost of escapes, cost of yield loss and the cost of 'More Test' are compared. The minimum cost determines the optimal decision thresholds $\hat{d}_P, \hat{d}_F$ 175. The determined subset of tests, the decision thresholds and the predicted decision variable are input to a verification path 205 using a verification set of devices 210 to determine the final test cost 215 of the calculated variables.

Adding sensor measurements is highly recommended, because they provide additional opportunities for correlation at minimum additional test cost. Measurement values can be obtained on the basis of sensor measurements.

Determining the Decision Function in Block 110 According to an Embodiment According to embodiments, the ideal decision function d(x) is based on all measurements x and constructed as a smooth sigmold function that changes most around the decision boundary between good and bad devices. It will be the fitting target for regression. The decision function may be defined as two-step mapping. First, a quality metric q(x) may be assigned, which is positive for good devices and negative for bad devices. Then a compression function g may be applied g(q) to make the decision function most sensitive around the decision boundary at zero. This results in the subsequent formula for the ideal decision function:

$$d(x)=g(q(x))$$

Normalization

It is assumed that raw measurements $X'_m$ have been normalized to $x_m$ with zero bias and unit standard deviations using the following formulas where μ indicates the mean value and a indicates the standard deviation of the measurements 35.

$$\mu_m^* = \frac{1}{N}\sum_{n=1}^{N} X_{nm}^*$$

$$\sigma_m^* = \sqrt{\frac{1}{N}\sum_{n=1}^{N}(X_{nm}^* - \mu_m^*)^2}$$

$$X_{nm} = \frac{X_{nm}^* - \mu_m^*}{\sigma_m^*}$$

To obtain a robust average and standard deviation, bad devices and clear outliers should be excluded, which may be performed in block 160, from the calculation. $\check{x}_m, \hat{x}_m$ are the lower and upper limits of normalized measurements m.

Quality Metric

Embodiments may comprise one example or any combination of the three examples of quality metrics described next.

The apparatus may form an ideal decision function using a quality metric and to fit the single decision function to the ideal decision function such that, if the single decision function is applied to a combination of the measurements, a quality measure is obtained indicating whether the combination of the measurements contributes to identifying whether the device under test passes the test. This enables the apparatus to analyze multiple (up to any) combination of measurements corresponding to the tests performed on one device under test using the ideal and/or the single decision function. This may be performed on multiple (up to any) device under test from the training set of devices under test 115. An accumulation or sum of the quality measures for any analyzed combination of measurements over the devices under test may result in a degree of relevance whether the combination of measurements, or in other words the respective combination of tests performed on the device under test, contributes to determining whether a device under test passes or fails to pass the tests, i.e. is classified as a good or a bad device. The quality metric may be the function applied to the measurements wherein the quality measure may be referred to the actual output value of the quality metric applied when applied to the measurements. The increased relevance may refer to a greater probability (or likelihood or expectation) that the test result is correct, i.e. that a device under test that is classified as to pass the set of tests is really a good device, and vice versa.

Specification Margin

Figure 10:
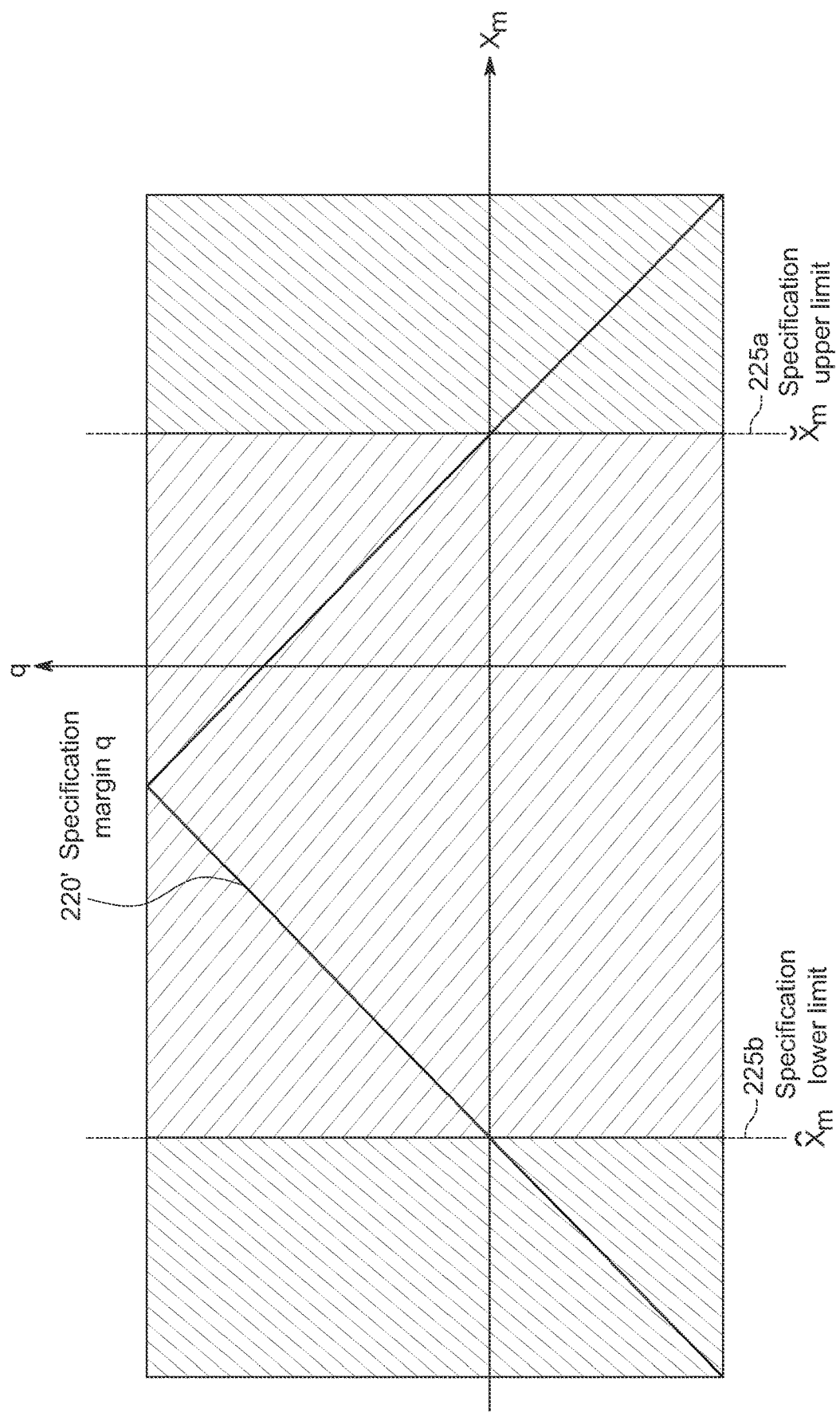
FIG. 10 shows a schematic diagram Indicating a specification margin q as quality measure.

FIG. 10 shows a schematic diagram indicating a specification margin q 220' as quality measure. The specification margin is defined as the closest distance to a specification limit, e.g. lower limit $\check{x}_m$ 225b, or upper limit $\hat{x}_m$ 225a of the eliminated measurements $\overline{M}$.

$$q^{Margin}(x) = \min_{m \in \overline{M}}(x_m - \hat{x}_m, \hat{x}_m - x_m)$$

Remember, measurements are normalized to unit standard deviation.

Figure 11:
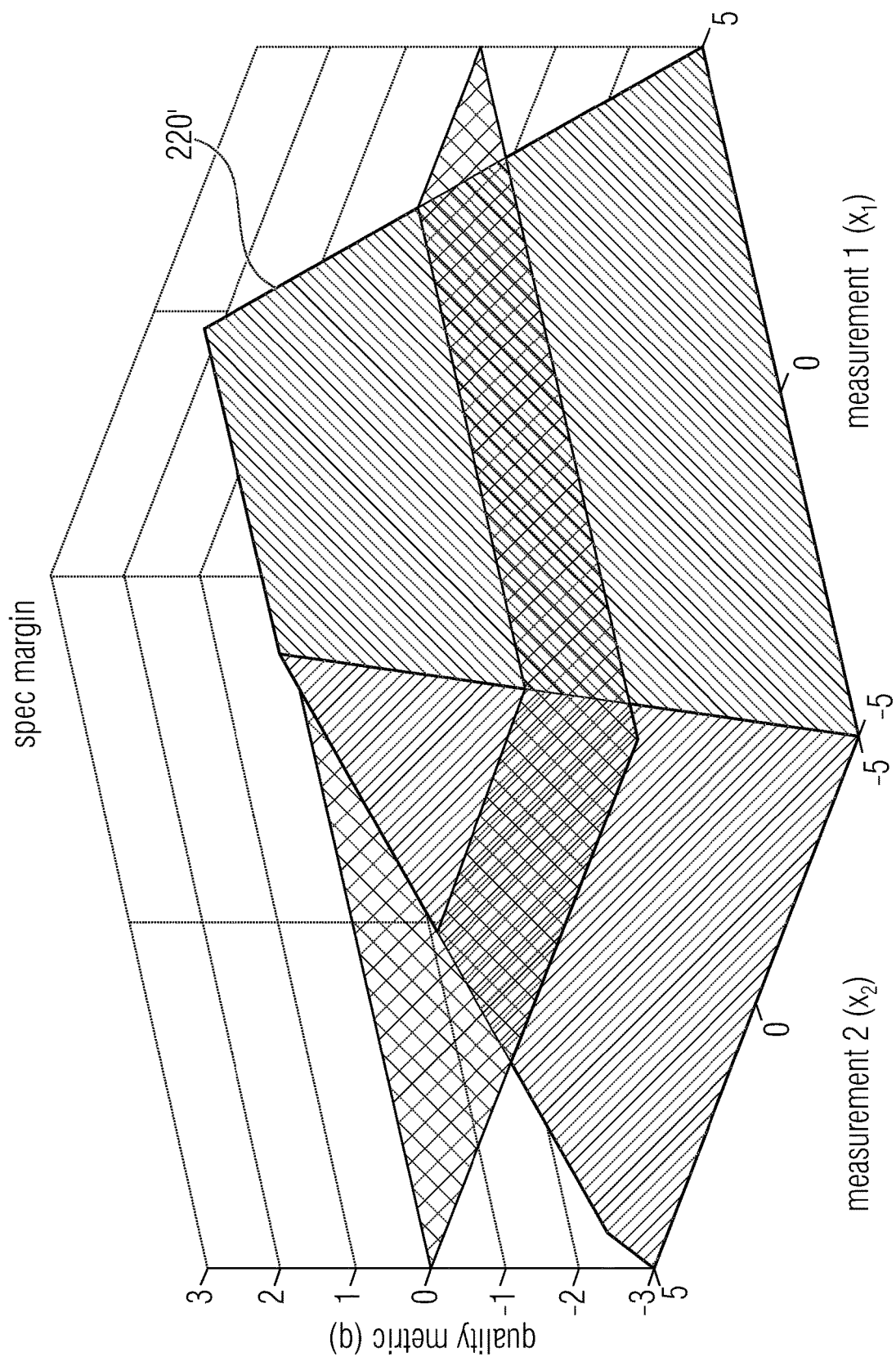
FIG. 11 shows a schematic 3D diagram Indication the specification margin q as quality measure.

FIG. 11 shows a schematic 3D diagram indicating the specification margin q 220' as quality measure in three dimensions (reflecting 2 measurements and the quality metric). Thus, FIG. 11 shows an example of a two-dimensional measurement space where measurement 1 has lower specification limit 1 and no upper specification limit, while measurement 2 has the specification limits [−3,+2]. The quality metric is shown in the measurement space based on the specification margin.

Mahalanobis Distance

The worst case (minimum) of both quality metrics, specification margin and Mahalanobis distance, defines a new combined quality metric 220'''.

$$q^{Comb}=\min(q^{Magon}, q^{Molar})$$

Figure 13:
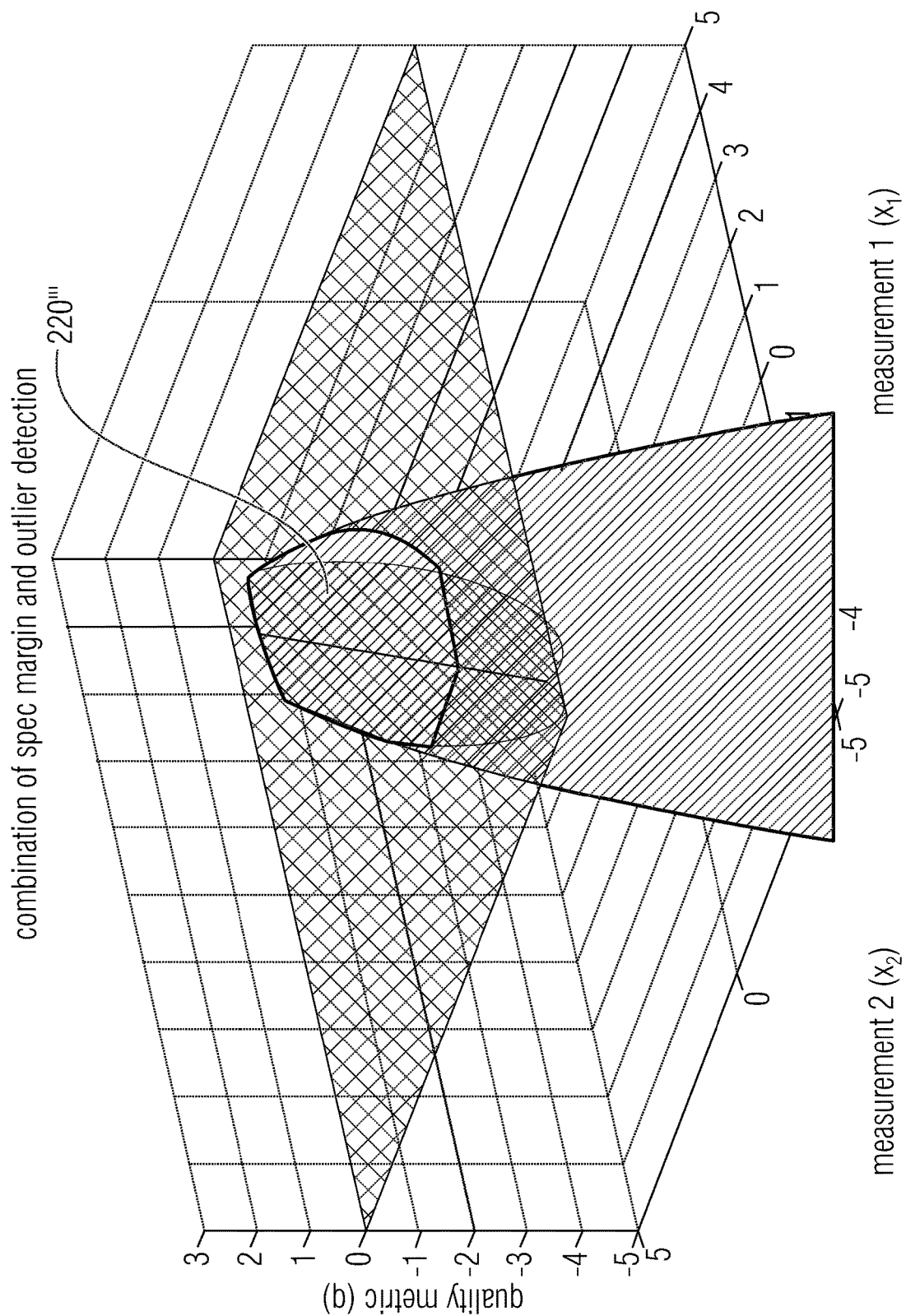
FIG. 13 shows a schematic 3D diagram of a quality metric based on a combination of specification margin and outlier detection.

FIG. 13 shows a schematic 3D diagram of a quality metric based on a combination of specification margin and outlier detection.

Compression Function

Figure 14:
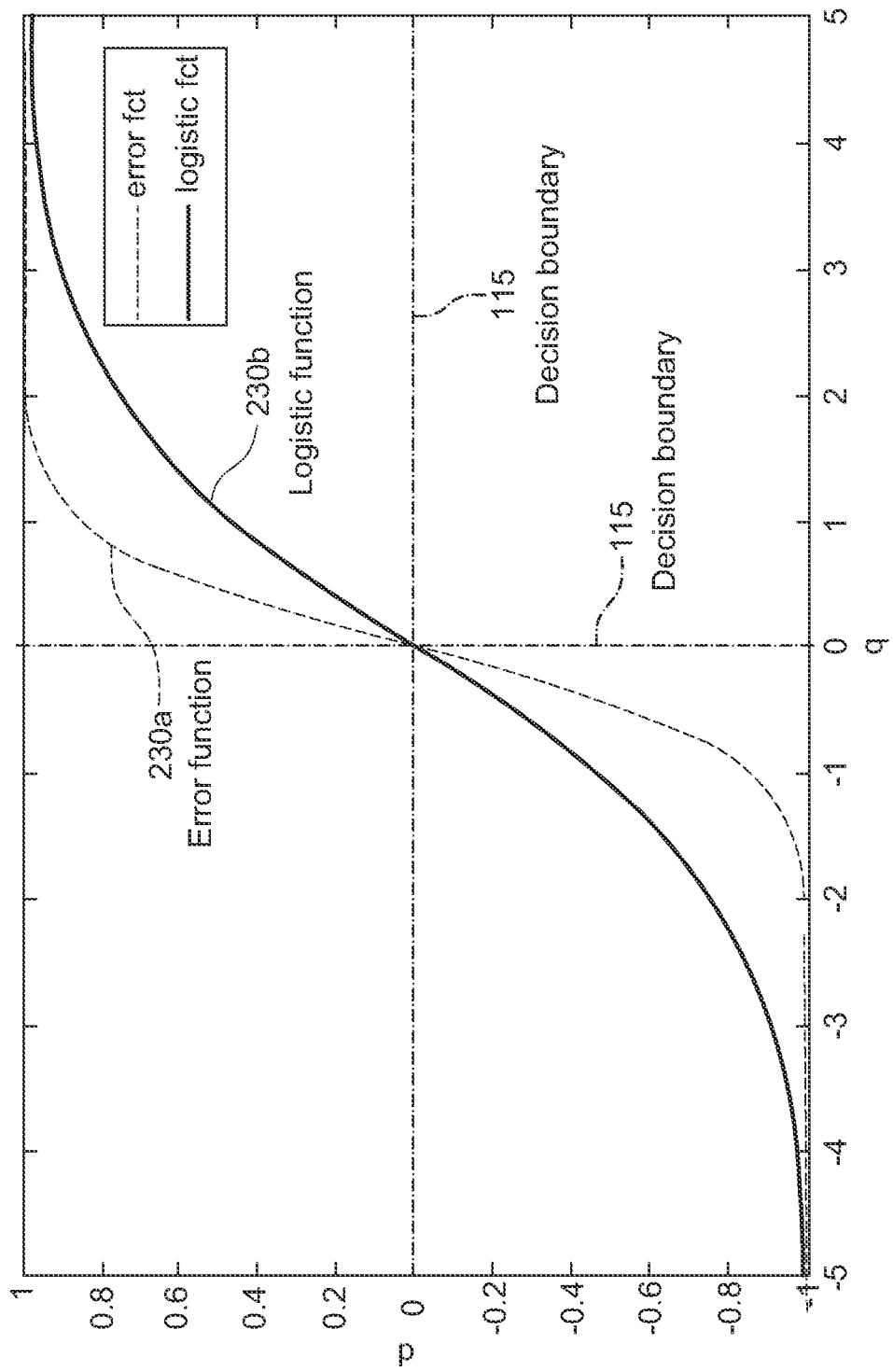
FIG. 14 shows a schematic diagram illustrating the error function and the logistic function for $\eta=1$.

To focus the later fitting process on the critical decision boundary 115, the decision variable d=g(q) employs a compression function g(q) that is a steep around the decision boundary and flat further away where the decision is clear, i.e. it is a scalar, smooth, sigmoid (slanted 'S') function. Example functions to obtain decision variable from quality metric are the error function 230a and the logistic function 230b. The logistic function may be scaled to range [−1,+1]. FIG. 14 shows a schematic diagram illustrating the error function 230a and the logistic function 230b for η=1. In other words, FIG. 14 reveals the translation of the quality metric q into the decision function d. Further, the decision boundary 115 is marked in relation to both, the quality metric and the decision function. The decision boundary may be arranged at the point where the quality metric is zero. Since zero is translated into zero when applying the compression function to obtain the decision function d, the decision boundaries are mutually applicable for both, the decision function after applying the quality metric and the decision function after applying the compression function to the quality metric. The exemplary compression functions are indicated below. A value of η>1 makes the compression steeper.

Error function: $g^{erf}(x)=erf(\eta \cdot q(x))$

Logistic function: $g^{log}(x)=2/(1+e^{-\eta \cdot q(x)})$

In other words, the apparatus may apply a compression function to the quality metric such that a curve shape (or curve progression) of the single decision function around a decision boundary (or threshold) 115 dividing areas of the single decision function indicating a device under test to pass the tests (e.g. above the decision boundary) and an area of the single decision function Indicating a device under test to fail passing the tests (e.g. below the decision boundary) is emphasized, i.e. steepened using e.g. the sigmoid shaped function.

Figure 12:
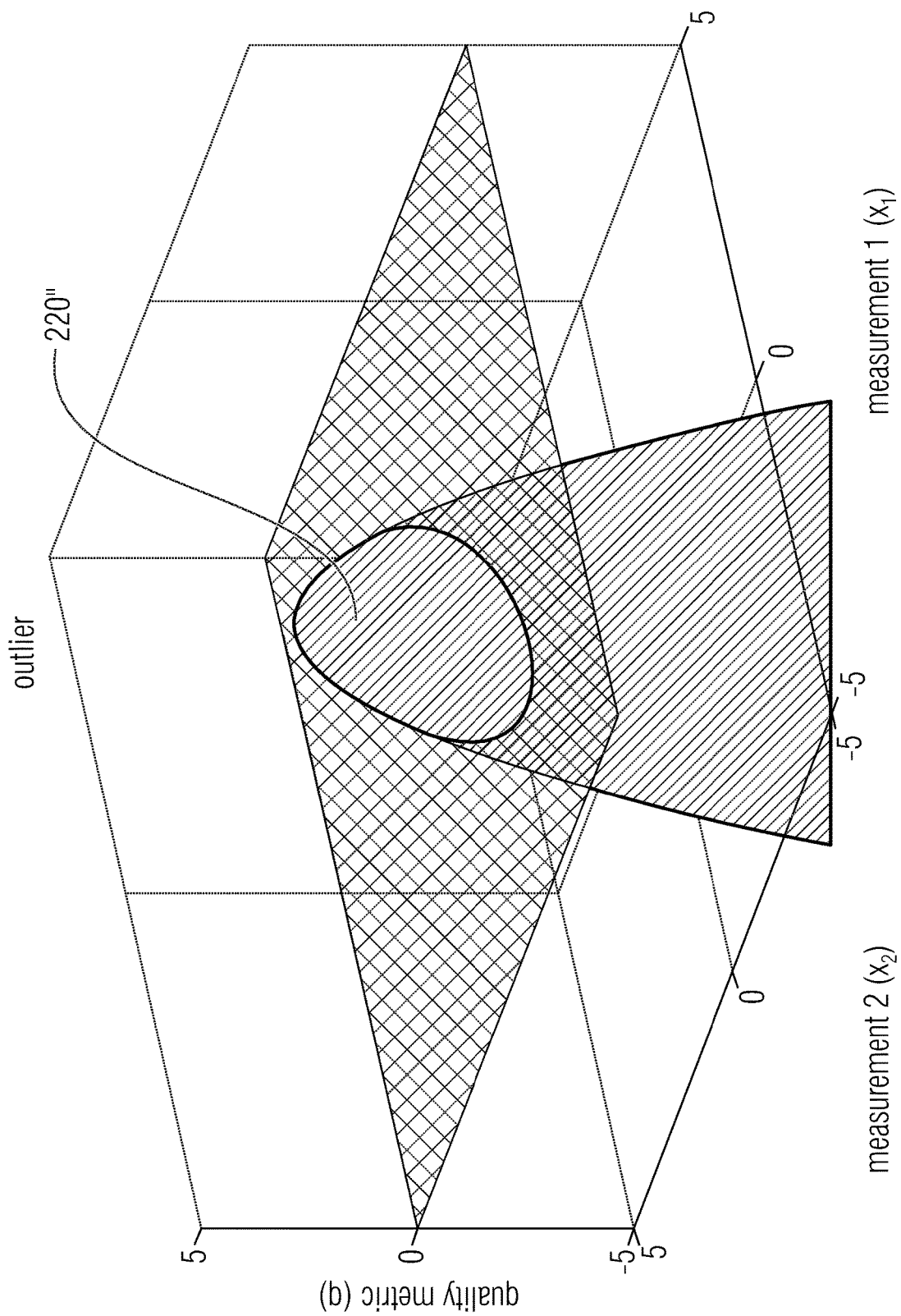
FIG. 12 shows a schematic diagram of a quality metric of slightly correlated measurements based on the Mahalanobis distance for outlier detection and limit $\mu=3$.

FIG. 12 shows a schematic diagram of a quality metric of slightly correlated measurements based on the Mahalanobis distance 220" for outlier detection and limit $\bar{\mu}=3$. This metric penalizes unusual combinations of measurement values, independent of their respective specification limits. This is also known as outlier detection. The Mahalanobis distance μ represents the number of multivariate standard deviations from average. For normalized measurements with zero mean it is defined as:

$$\mu=\sqrt{x'R^{-1}x}.$$

where R is the m×M covariance matrix with elements $R_{ij}$ $$R_{ij} = \frac{1}{N}\sum_{n=1}^{N} X_{ni} X_{nj}$$

$$R = \frac{1}{N} X'X.$$

In the expected case where measurements correlate well, the covariance matrix is badly conditioned and may be regularized by adding αi, with unit matrix t.

$$\mu=\sqrt{x'(R+\alpha I)^{-1}x}$$

Based on this, a quality metric can be defined that is positive for passing and negative for failing devices, where p is pass/fail limit.

$$q^{Mahal}(x)=\tilde{\mu}-\mu(x)$$

In other words, the apparatus may use the Mahalanobis distance as the quality metric as to penalize unusual combinations of measurements indicating that the respective device under test revealing such an unusual combination of measurements fails to pass the test. Thus, even though all tests are within specifications, a device under test may be classified as being off specification (not within specification) if the combination of measurements is seldom/unusual, which may be measured in terms of the Mahalanobis distance.

Combination

EXAMPLES

Figure 15A:
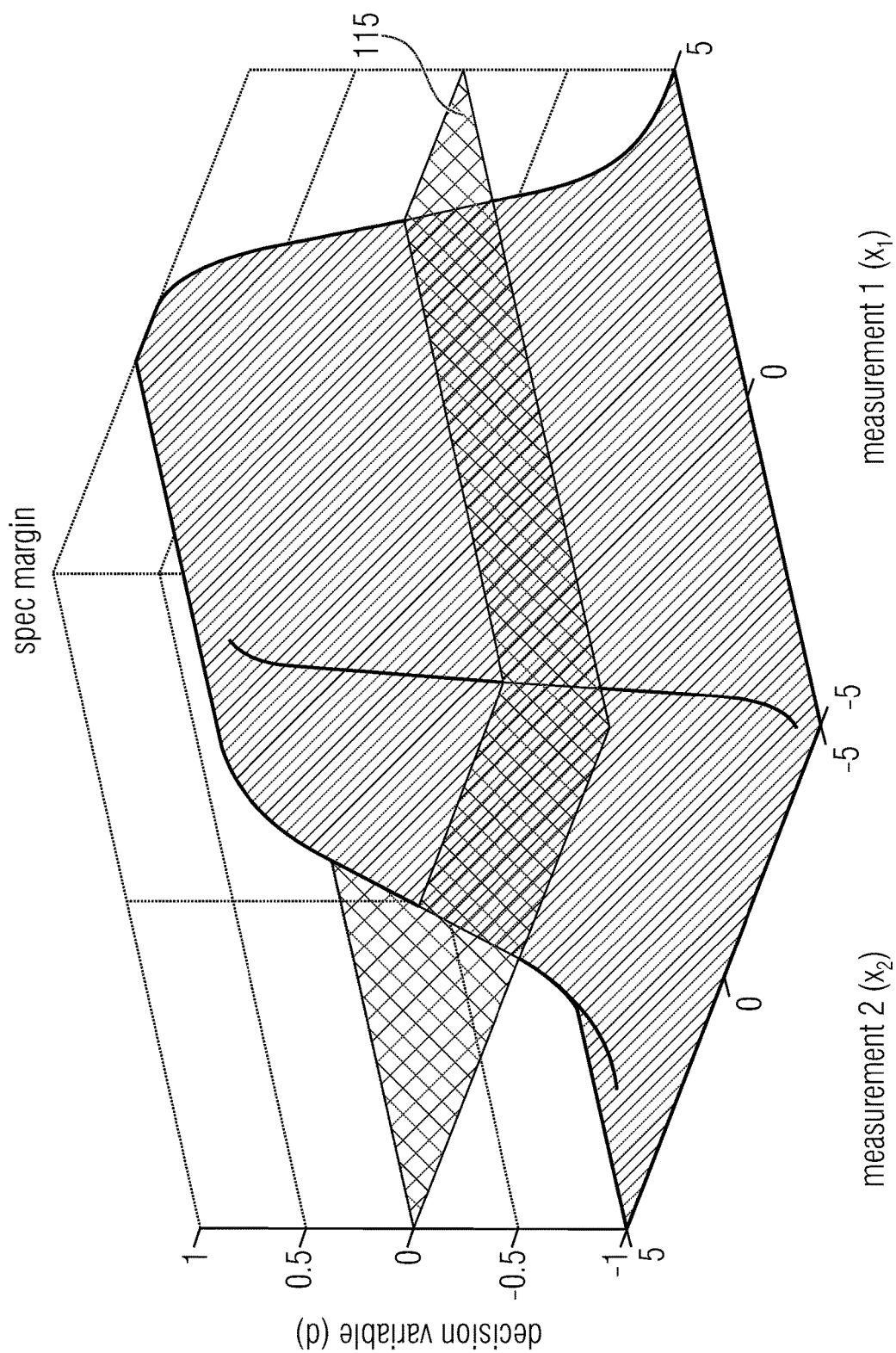
FIG. 15a shows a schematic 3D diagram of a decision variable in measurement space based on specification margin and error function for compression.
Figure 15B:
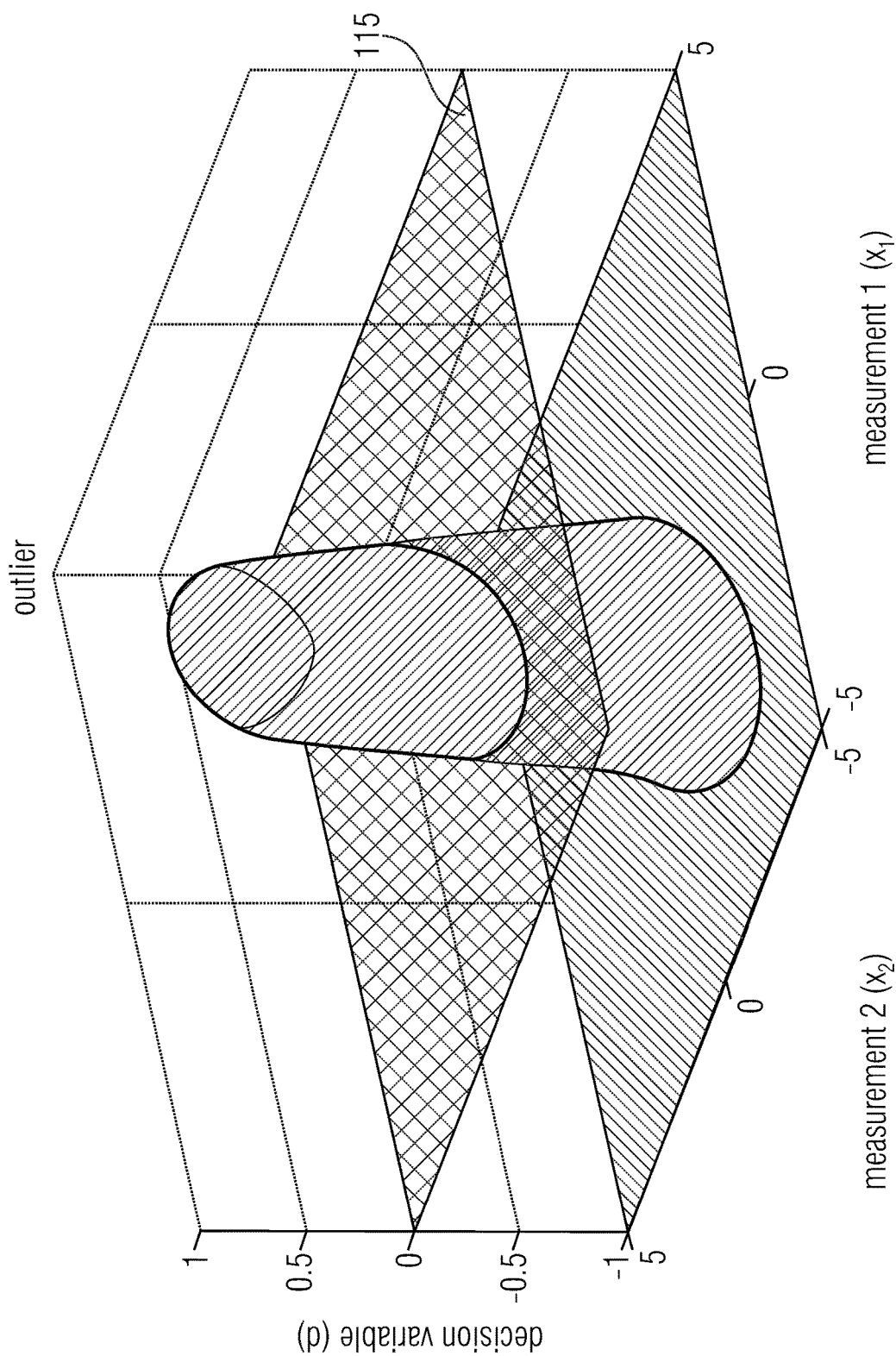
FIG. 15b shows a schematic 3D diagram of a decision function in measurement space based on Mahalanobis distance for outlier detection and error function for compression.
Figure 15C:
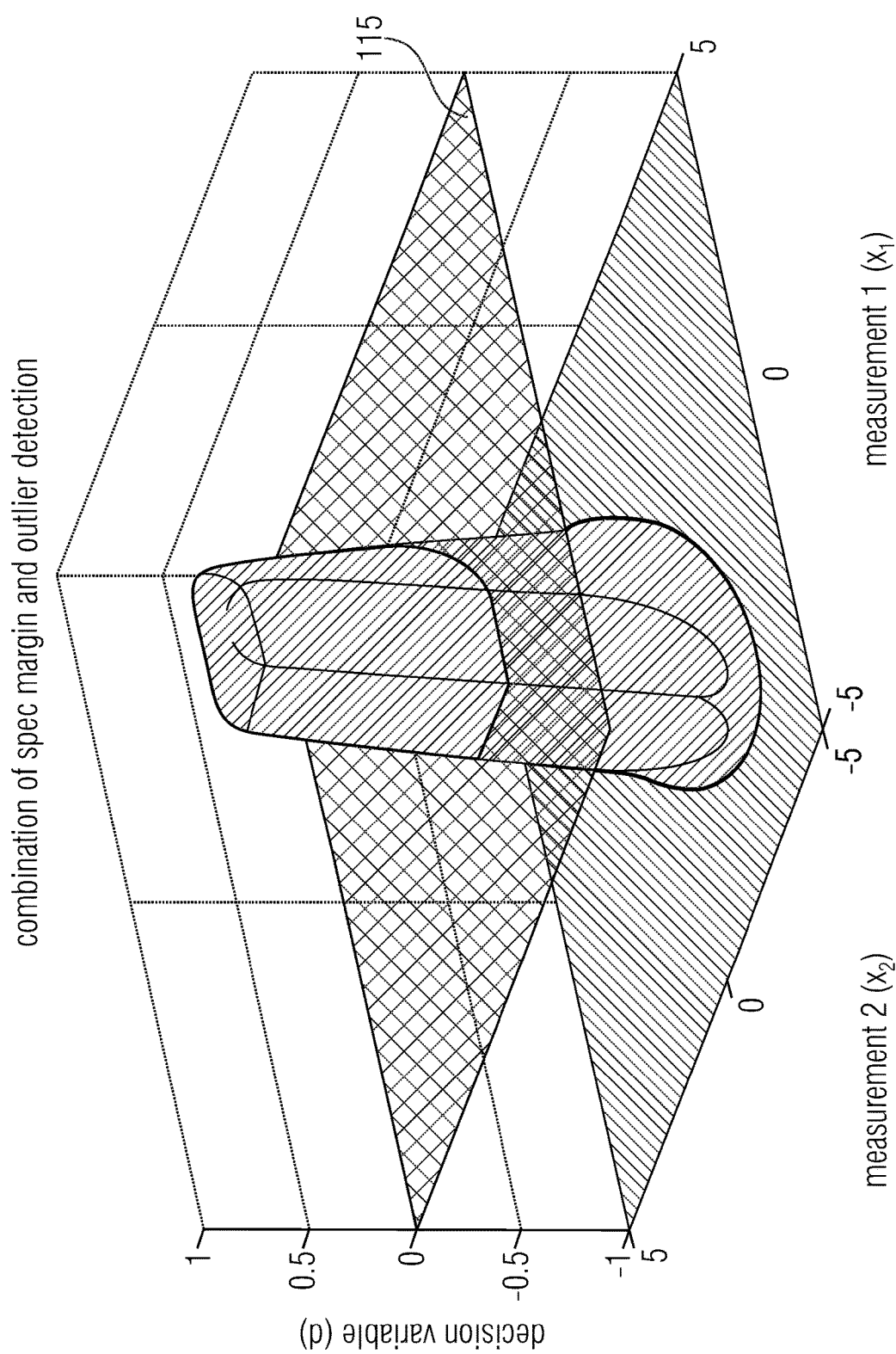
FIG. 15c shows a schematic 3D diagram of a decision function based on a combination of specification margin and Mahalanobis distance for outlier detection.

The following FIGS. 15a-c show the decision variable as a function of measurements for the three cases of the quality metric. FIG. 15a shows a schematic 3D diagram of a decision variable in measurement space based on specification margin and error function for compression. FIG. 15b shows a schematic 3D diagram of a decision function in measurement space based on Mahalanobis distance for outlier detection and error function for compression. FIG. 15c shows a schematic 3D diagram of a decision function based on a combination of specification margin and Mahalanobis distance for outlier detection.

Test Pre-Selection of Block 160 According to Embodiments

Test pre-selection is an optional first step that excludes clearly unimportant tests, and/or definitely selects clearly important tests based on test importance metrics $\theta_k$. Thus, the importance metrics $\theta_k$ may be a measure of a relevance of the subset of tests indicating whether the plurality of devices under test pass the tests (or fail to pass the tests). Using more tests, the overall (or cumulated) relevance of the subset of tests increases. In embodiments, the pre-selected tests form the subset of tests. In further embodiments, the pre-selected tests are further reduced e.g. by Lasso regression to form the subset of tests. In even further embodiments, there is no pre-selection performed and the subset of tests is formed in a further step, e.g. the Lasso regression. A large number of the importance metrics $\theta_k$ indicates an Important test. Several examples are given. Combinations are possible.

Failing Parts

A test is important when a large number $f_k$ of devices fails test k in a short test time $T_k$.

$$\theta_k = \frac{f_k}{T_k}$$

Uniquely Falling Parts

A test is important when a large number $u_k$ of devices fails only test k but no other test in a short test time $T_k$.

$$\theta_k = \frac{u_k}{T_k}$$

Importance of Measurements

A test k is considered important, if it gathers measurements m∈$M_k$ with high importance $\partial_m$ in a short test time.

$$\theta_k = \frac{1}{T_K} \sum_{m \in M_k} \partial_m$$

Some examples of importance metrics for a single measurement 4 will be defined next.

Critical Specification Margin

Measurement m is important if its specification margins $Q_m$ $$Q_m=\min(X_{nm}-\tilde{x}_m, \tilde{x}_m-X_{nm})$$

are the most critical (smallest) for a large number of devices $$\partial_m^{Critical}=|\{n:Q_{nm}=Q_{n,min}, n \in N\}|.$$

with the smallest specification margin for device n $$Q_{n,min} = \min_{m \in M} Q_{nm}.$$

Critical Fails

Measurement m is important if its specification margins $Q_{nm}$ are the most critical (smallest) for a large number of bad devices.

$$\partial_m^{Critical} = |\{n: Q_{nm} = Q_{n,min} \gamma_n = 0, n \in N\}|$$

Correlation

Figure 16:
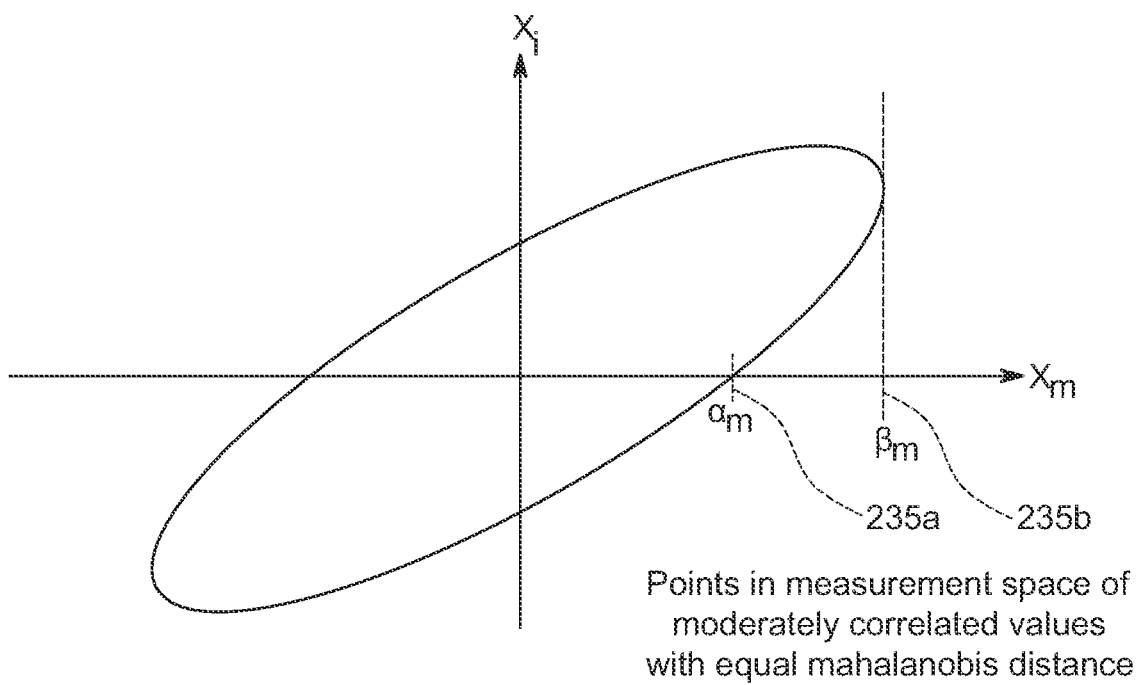
FIG. 16 shows a schematic diagram of points In measurement space of moderately correlated values with equal Mahalanobis distance.

Consider a hyper-plane in measurement space with equal Mahalanobis distance. FIG. 16 shows a schematic diagram of points in measurement space of moderately correlated values with equal Mahalanobis distance. When $\beta_m$ 235b is small, the measurement Is not important and therefore is a good candidate for elimination. When $\alpha_m/\beta_m \ll 1$ this measurement is highly correlated to others. $\alpha_m$ is indicated by reference sign 235a. One or more of the correlated partners can be eliminated. It is not clear which. When $\alpha_m/\beta_m = 1$ this measurement is not correlated to others, but it may not be important in the first place. Examples metrics are: $\beta_m$, and $\sqrt{\alpha_m \beta_m}$ as combined measure for absolute importance, weighted with its independence.

Shrunk Coefficients

Fit to decision variable with all measurements using Ridge regularization so that effort is concentrated on really important coefficients $a_j$ but—unlike with Lasso regularization—coefficients are not shrunk to zero.

$$\partial_m^{Shrink} = \sqrt{\sum_{j: m \in M^j} a_j^2}$$

Note, the LASSO L1-regularization, $\Sigma |a_i|$, is not suitable because it shrinks some coefficients to zero.

Ridge Regression/Ridge Regularization

This section assumes a given test subset and thus a given subset of measurements. The goal is to fit a predicted decision function $\tilde{d}(\tilde{x})$ which has only access to a subset of measurements $\tilde{x}$ to the ideal decision function $d(x)$, $\tilde{d}(\tilde{x})$ is constructed as linear sum of basis terms $\tilde{b}_j(\tilde{x})$ with parameters $\tilde{a}_i$ as weights, combined to parameter vector $\tilde{a}$.

$$\tilde{d}(\tilde{x}) = \tilde{f}_{\tilde{a}}(\tilde{x}) = \sum_{j=1}^{J} \tilde{a}_j \tilde{b}_j(\tilde{x})$$

The approximation minimizes a loss function L that approximates overall test cost. Herein, parameter vector $\tilde{a}_j$ indicates the weight applied to the basis functions which is to be estimated using fitting to the ideal decision function. The predicted decision function may be determined for each device under test. To obtain a generalized result, the parameter vector should be chosen such that the predicted decision function is similar for the devices under test.

Generally the fitting target is the ideal decision function $d(x)$. When the decision function contains no cross-correlation terms, like for the Mahalanobis distance, see section "Mahalanobis distance" above, it may be more accurate to predict only the influence of removed measurements $d(\tilde{x})$. It makes no sense to predict the influence of kept and thus known measurements. In both cases the fitting target is now called $d(x)$.

Basis Functions (Block 155)

Figure 17:
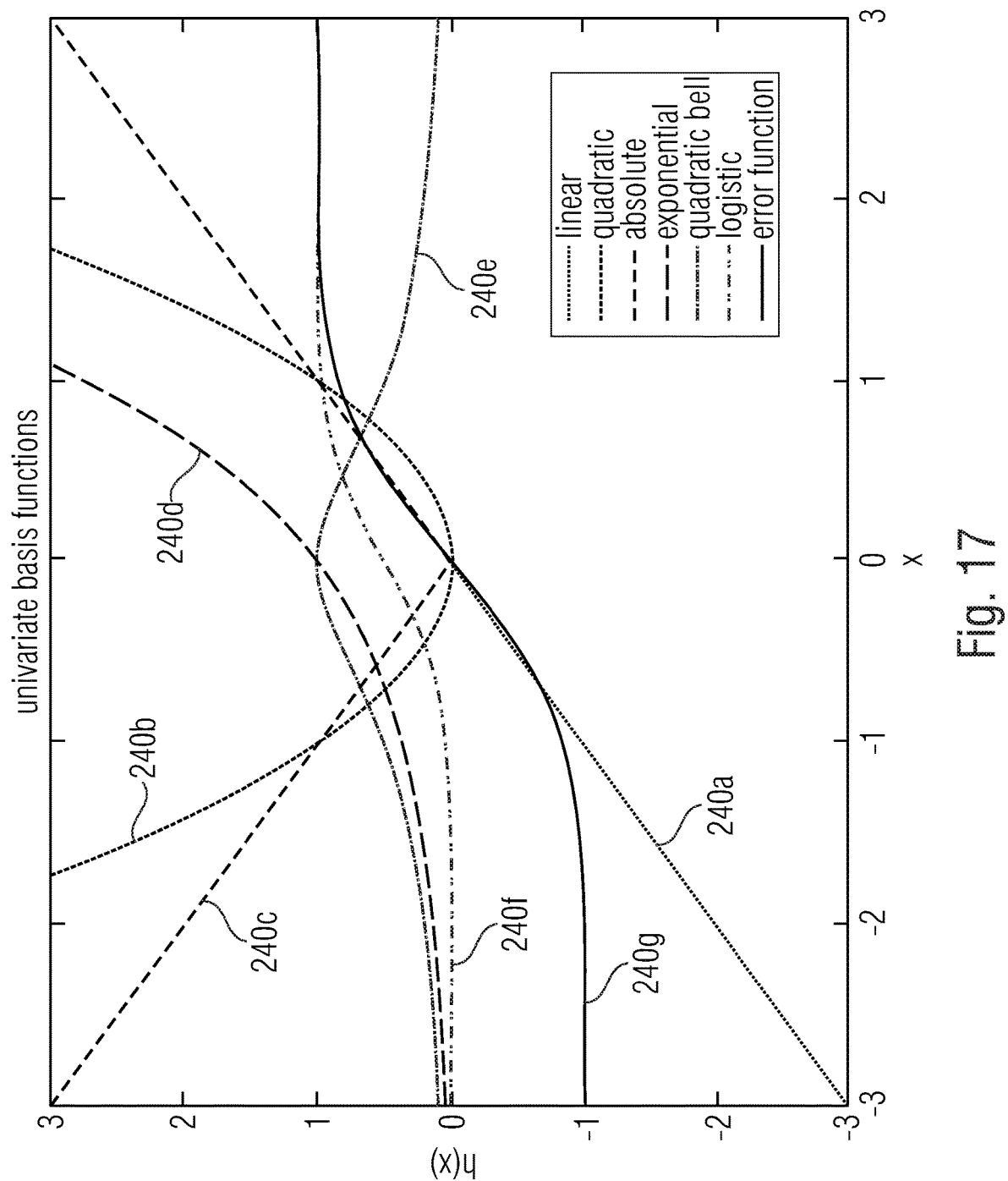
FIG. 17 shows a schematic diagram indicating the listed univariate basis functions.

To fit sigmoid decision functions, the basis functions are chosen to best model steep transitions near decisions boundaries. A number of univariate basis functions and a potential usage are listed below. FIG. 17 shows a schematic diagram indicating the listed univariate basis functions.

| | | |
|---|---|---|
| Constant term | 1 | To compensate bias |
| Linear 240a | $\tilde{x}_m$ | The default |
| Quadratic 240b | $\tilde{x}^2_m$ | For symmetric deviations. |
| Absolut 240c | $|\tilde{x}_m|$ | For symmetric deviations. |
| Exponential 240d | $e^{\tilde{x}_m}$ | For strong dependence |
| Quadratic bell 240e | $1/(1 + \tilde{x}^2_m)$ | For symmetric well behaved deviations. |
| (Scaled) Logistic function 240f | $2/(1 + e^{-\pi \tilde{x}_m}) - 1$ | For one-sided smooth transition. |
| Error function 240g | erf(x) | For one-sided smooth transition. |

Figure 18A:
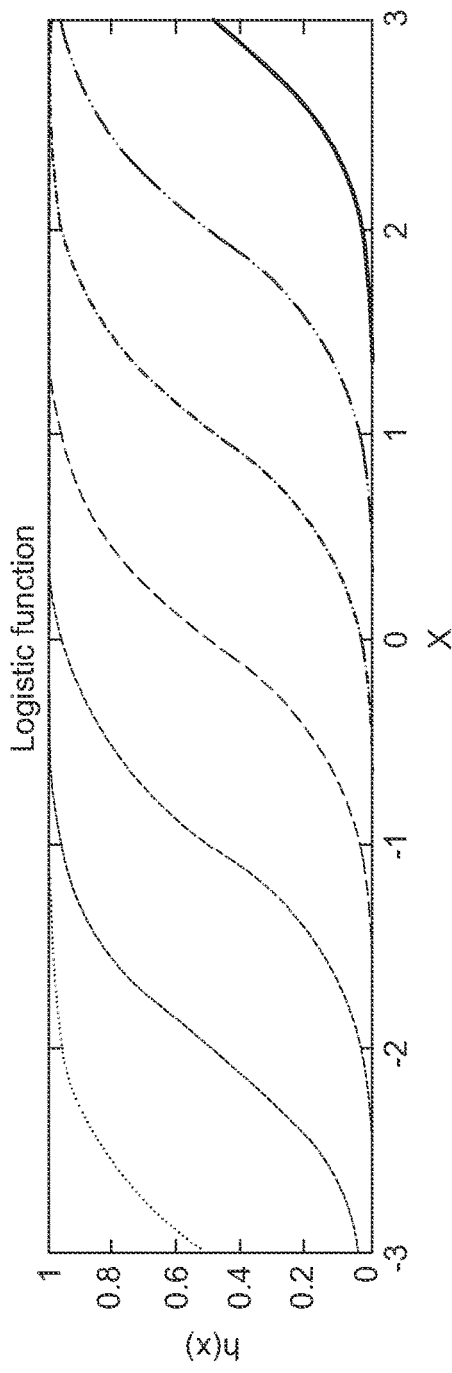
FIG. 18a shows a schematic diagram of a shifted version of the logistic function.
Figure 18B:
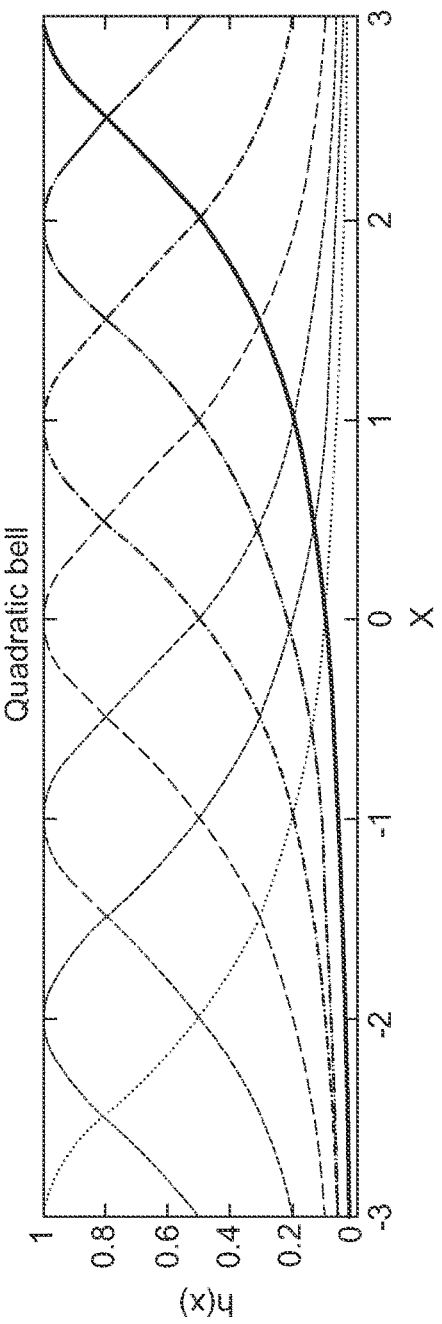
FIG. 18b shows a schematic diagram of a shifted version of the quadratic bell function both functions using a predefined translation $\tilde{\xi}_c$ along $\tilde{x}_m$.

To model transitions near the decision boundary, shifted versions of the logistic function and the quadratic bell function seem most suitable, because they span the range $[-1,+1]$ and have only one or two localized transition regions. FIG. 18a shows a schematic diagram of a shifted version of the logistic function and FIG. 18b shows a schematic diagram of a shifted version of the quadratic bell function both functions using a predefined translation $\xi_m$, along $\tilde{x}_m$.

$$b_j(x_m) = \frac{1}{1 + (\tilde{x}_m - \xi_m)^2}$$

$$b_j(x_m) = \frac{1}{1 + e^{-\pi(\tilde{x}_m - \xi_m)}}$$

Figure 19A:
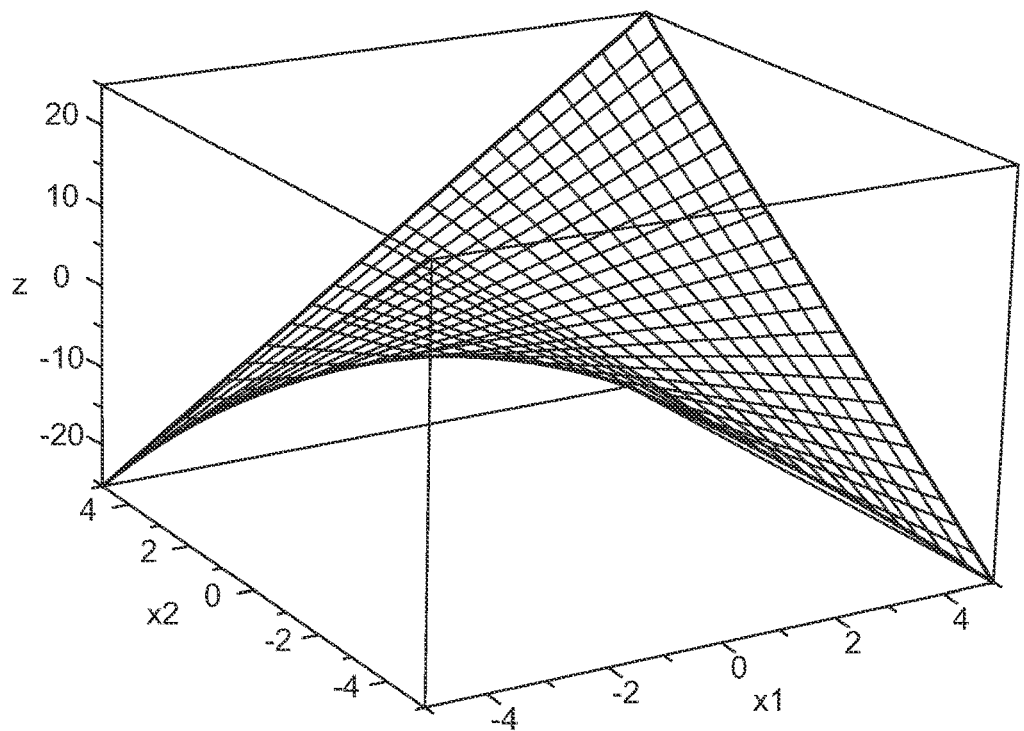
FIG. 19a shows a schematic diagram of a bilinear basis function.
Figure 19B:
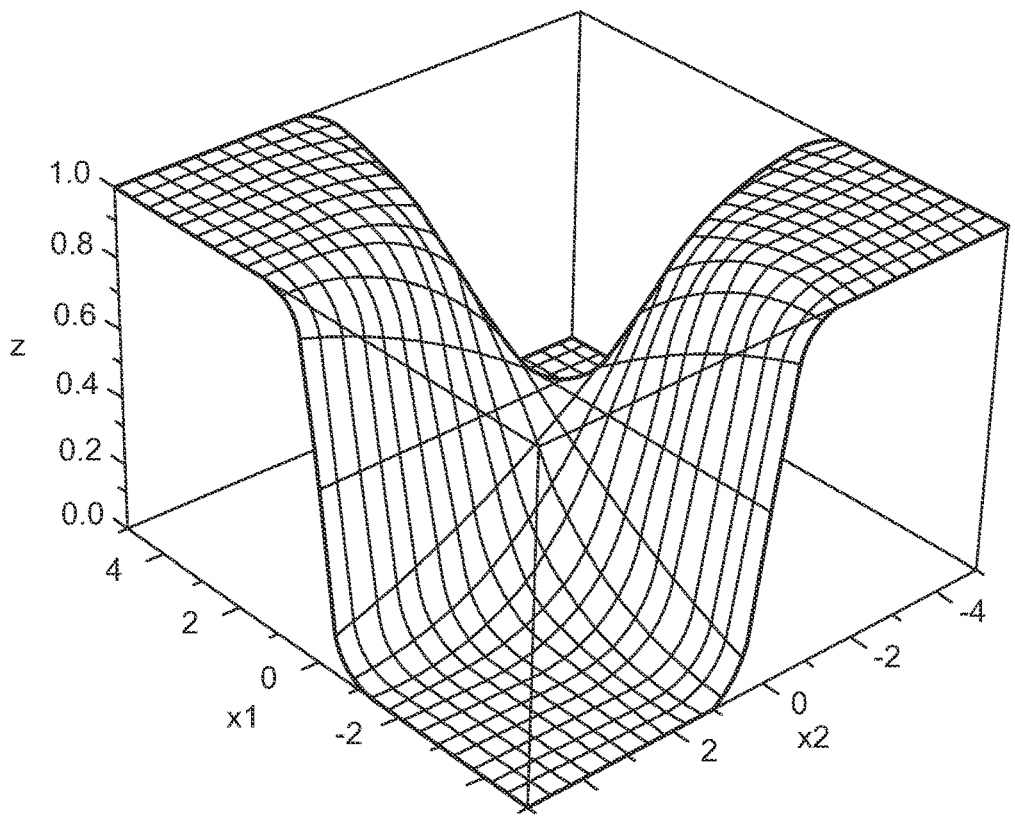
FIG. 19b shows a schematic diagram of a bilinear logistic function.

Due to the huge number of possible bivariate functions for large number of measurements, it can be impractical to fit to bivariate functions, unless special knowledge can be exploited. Nevertheless two types are mentioned and listed below that are suitable in general and especially in cases with fewer measurements. FIG. 19a shows a schematic diagram of a bilinear basis function and FIG. 19b shows a schematic diagram of a bilinear logistic function.

Bilinear $\tilde{x}_m, \tilde{x}_i$ For general quadratic Taylor expansion

Bilinear logistic $1/(1+e^{\tilde{x}_m \tilde{x}_i})$ Smooth correspondent to Walsh function $M^j$ denotes the set of measurements involved in term $\tilde{b}_j(\tilde{x})$, e.g. $M^3 = \{2,4\}$ for $\tilde{b}_1 = \tilde{x}_2 \cdot \tilde{x}_4 \cdot K^i$ denotes the set of tests involved in term $\tilde{b}_j(\tilde{x})$. Typically, one basis function may be used to represent one measurement, i.e. to model one measurement, or only very few measurements.

Selection of Basis Terms

For a given subset of measurements, the idea is to provide a pool of (too) many basis functions and avoid over-fitting through regularization as part of the optimization itself. Note, over-fitting can occur when basis functions are not orthonormal. Embodiments show to choose basis functions prior to test selection, because the best choice depends on the specific subsets of measurements, which is supposed to predict the decision variable for the eliminated measurements. With all measurements available, it would be a trivial task to fit the decision variable.

Loss Function with Ridge Regression (Block 140)

The apparatus may determine the single decision function using a set of basis functions (as described above) reflecting the subset of tests (e.g. one basis function is chosen to represent one measurement) and to fit the set of basis functions to an ideal decision function using Ridge regression to optimize a loss function.

The loss function L penalizes classification errors and applies Ridge regularization to resolve the ambiguity due to non-orthonormal basis functions by penalizing large coefficients. Strongly correlated basis functions with large coefficients that cancel each other are avoided this way. Ridge regression adds the 2-norm $\|\tilde{a}\|_2$ of the coefficient vector as penalty. Although the test subset is assumed to be known in this section, weighting the coefficients $\tilde{a}_j$ with the cost of test times used for basis term $\tilde{b}_j(\tilde{x})$, is more consistent with test selection.

$$v_j = c_T \sum_{k \in K^j} T_k$$

Note, the constant basis term uses no test at all and has therefore a zero weight associated.

Thus, the apparatus may determine the single decision function by optimizing the loss function reflecting the costs for misclassification of a device under test and the costs to perform a further test on the device under test. The Lagrange multiplier may weight the influence of both costs, e.g. If on cost is worse than the other. E.g. a company attaching importance to the quality of their devices, e.g. to keep a good reputation, may assign a greater weight to the costs for misclassification since the actual loss to sell a broken device may be higher than the monetary cost.

The weighted 2-norm is therefore added to the loss function as generalized Ridge regression penalty with Lagrange multiplier $\lambda$.

$$L = \sum_{n \in N} L_{Err}(d, \tilde{d}) + \lambda \sum_{j=1}^{J} v_j \tilde{a}_j^2$$

The optimal coefficient vector $\tilde{a}$ minimizes the minimum expected (total) loss across devices.

$$\hat{a} = \underset{\tilde{a} \in R^J}{\operatorname{argmin}} \sum_{n \in N} L(d_n, f_{\tilde{a}}(\tilde{x}_n))$$

To obtain an optimization problem with analytic solution, $L_{\varepsilon rr}(\tilde{a})$ is designed as quadratic function of parameter vector $\tilde{a}$ that resembles the cost of classification errors. It is therefore chosen as least squares error of $d_n - \tilde{d}_n$ with weights $w_n$ that model the cost of escapes and yield loss. Embodiments show considering the cost of 'more test' in a further step, because the thresholds for 'more test' are computed later, not as part of this optimization.

$$L_{Err} = \sum_{n \in N} (d_n - \hat{d}_n)^2 w_n$$

$w_n$ can depend on $d_n$, but not on $\tilde{d}_n = f_{\tilde{x}}(\tilde{x}_n)$, otherwise $L_{En}$ would not be quadratic in $\hat{a}$. One choice that ensures a smooth continuous function $L(d, \tilde{d})$ is:

$$w_n = c_{YL} \frac{1}{1 + e^{-\omega d_n}} + c_E \frac{e^{-\omega d_n}}{1 + e^{-\omega d_n}}$$

with compression factor $\omega$. Note that $w_n$ are given for a given training set.

Example

For bad devices, $d_n \ll 0$, a wrong classification (pass) is penalized with the cost of escapes, e.g. $c_\varepsilon = 10$, for good, $d_n \gg 0$, a wrong classification (fail) is penalized with the cost of yield loss, e.g. $c_{YL} = 2$.

Figure 20:
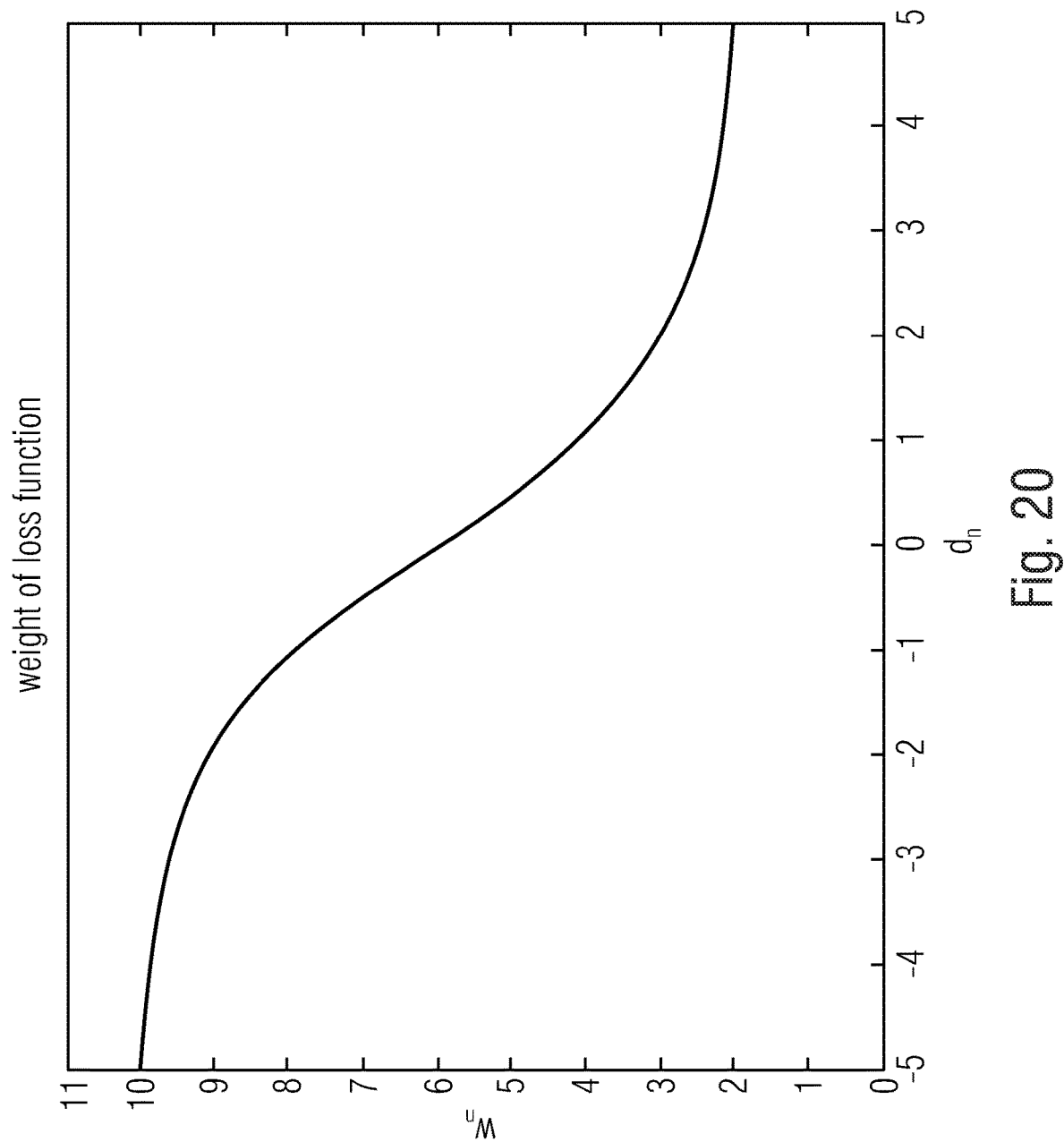
FIG. 20 shows a schematic diagram illustrating a weight function with $\omega=1$ that approximates the cost of escapes and yield loss with a smooth transition region.

FIG. 20 shows a schematic diagram illustrating a weight function with $\omega = 1$ that approximates the cost of escapes and yield loss with a smooth transition region. The weight for bad devices ($d_n \leq 0$) may be much higher than the weight for good devices ($d_n > 0$) as described in the example above.

Figure 21:
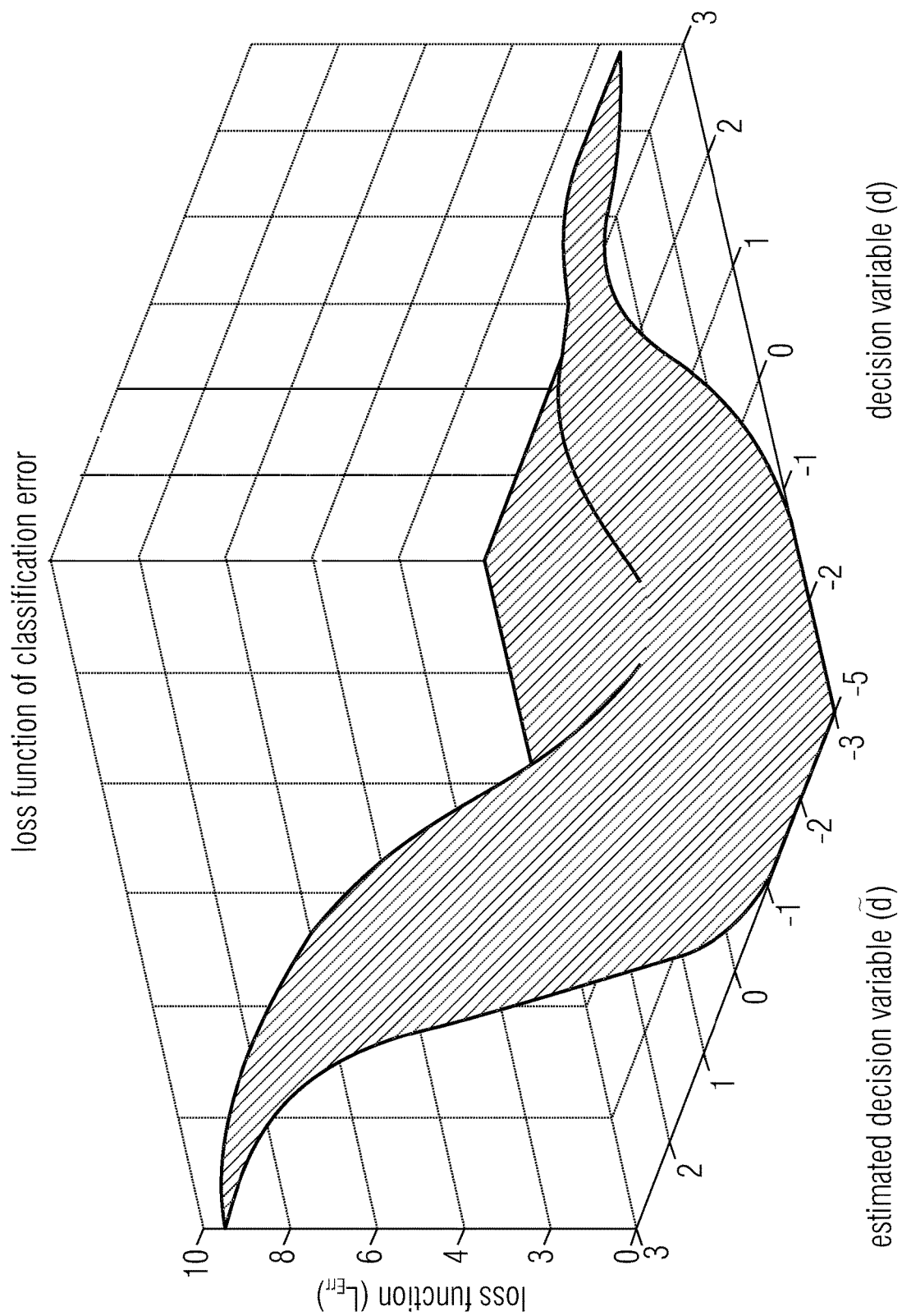
FIG. 21 shows a schematic 3D representation of a loss function for classification error.

FIG. 21 shows a schematic 3D representation of a loss function for classification error. The loss function can now be expressed in compact matrix notation:

$$L(\tilde{a}) = \|d - \tilde{d}\|_{2,W} + \lambda \cdot \|\tilde{a}\|_{2,V}$$

Vectors $d, \tilde{d}$ combine the decision function values $d_n, \hat{d}_n$ of all devices $n \in N$. Cost of classification errors are modeled as the weighted 2-norm of the prediction errors of the decision functions $d - \tilde{d}$ of all devices. Diagonal elements $w_{nm} = w_a$ of N×N diagonal weight matrix w reflect the relationship between cost of escapes vs cost of yield loss. Test time cost is modeled as regularization with weighted 2-norm of parameter vector i. Diagonal elements $V_{jj} = v_j$ of J×J diagonal weight matrix v reflect the different test time contributions. Note, the constant basis term involves no test at all and has therefore a zero weight associated.

Solution According to an Embodiment

With N×J matrix $\tilde{B}$ and its elements $\tilde{B}_{ij} = \tilde{b}_j(\tilde{x}_n)$ $$\tilde{d} = \tilde{B} \cdot \tilde{a}$$

The loss function becomes $$\begin{aligned} L(\tilde{a}) &= \|d - \tilde{d}\|_{2,W} + \lambda \|\tilde{a}\|_{2,V} \\ &= (d - \tilde{d})' W (d - \tilde{d}) + \lambda \tilde{a}' V \tilde{a} \\ &= (d - \tilde{B}\tilde{a})' W (d - \tilde{B}\tilde{a}) + \lambda \tilde{a}' V \tilde{a} \end{aligned}$$

As desired this is a quadratic optimization problem with weights in slightly modified form. Solution $\hat{a}$ has zero derivative w.r.t. $\tilde{a}$ $$\left. \frac{dL}{d\tilde{a}} \right|_{\tilde{a} = \hat{a}} = -2(d - \tilde{B}\hat{a})' W \tilde{B} + \lambda \cdot 2\hat{a}' V = 0$$

leads to $$(\tilde{B}' W \tilde{B} + \lambda V)\hat{a} = \tilde{B}' W d$$

And finally to solution $$\hat{a} = (\tilde{B}' W \tilde{B} + \lambda V)^+ \cdot \tilde{B}' W d$$

$A^+$ denotes the Moore-Penrose pseudo-inverse of matrix A.

The aforementioned modification does not use linear coefficient weights used in linear regression and therefore test times may not be counted multiple times when tests are used multiple times in different basis functions.

LASSO Regression with Subset Selection According to an Alternative Embodiment of Block 140

L1-regularization leads to a solution with minimum number of non-zero components of the unknown parameter vector a. Unlike the more standard Ridge regularization with the 2-norm $\|a\|_2$, LASSO regression uses the 1-norm, $\|a\|_1$.

Loss Function

The idea is therefore to replace the weighted 2-norm penalty in the loss function by a weighted 1-norm penalty:

$$L(a) = \|d - \tilde{d}\|_{2,W} + \lambda \|a\|_{1,V}$$

For this specific optimization problem, an increasing Lagrange multiplier $\lambda$ shrinks an increasing set $\tilde{J}$ of coefficients a; for basis functions $b_j(x)$ to zero, $a_{jc3}=0$, i.e. $\tilde{J}=\{j:a_j=0\}$. Effectively, Lagrange multiplier t balances the ratio of cost of classification errors vs the cost of test time.

Note, since test selection occurs now implicitly, the optimization has access to all measurements x, not only to a subset $\tilde{x}$, therefore coefficients are denoted a, as opposed to $\tilde{a}$, although some test pre-selection may have been performed.

Solution According to an Embodiment

With d=B·a, the optimization problem can be written as $$L(a) = \|d - Ba\|_{2,W}^2 + \lambda \|a\|_{1,V},$$

for a given $\lambda$, the solution $$\tilde{a}(\lambda) = \underset{a \in R^j}{\mathrm{argmin}}(L(a))$$

can be found with standard software packages for LASSO regression.

Selected Tests

Tests k whose measurement values are all only referenced in basis functions $b_j(x)$ with zero coefficients, $\tilde{a}_j=0$, $j \in \tilde{J}$, are not needed and can be eliminated, $k \in \overline{\tilde{K}}$. Reversely, a test k is selected, $k \in \tilde{K}$, when any of its measurements is referenced in any of the basis functions with non-zero coefficients.

$$\tilde{K} = \bigcup_{j \in \tilde{J}^-} K^j = \bigcup_{j:\tilde{a}_j \neq 0} K^j$$

Because coefficients i are a function of $\lambda$, the selected test subset is also a function of $\lambda$.

$$\tilde{K} = \tilde{K}(\tilde{a}(\lambda)) = \tilde{K}(\lambda)$$

Thus, the apparatus may determine the single decision function using a set of basis functions reflecting the set of tests (it is possible but not necessary to perform a pre-selection of the tests) and by fitting the set of basis functions to an ideal decision function using a least absolute shrinkage and selection operator (LASSO) to determine the single decision function d=B·a and to determine the subset of tests $\tilde{K}$.

Optimize $\lambda$

Solution $\hat{a}(\lambda)$ is valid for a given value of the Lagrange multiplier $\lambda$, which balances cost of misclassification vs test time cost. To obtain the overall cost minimum, the best value of $\lambda$ may be found. Because test subset $\tilde{K}(\lambda)$ is known for a given $\lambda$, test time cost can be expressed using equation (1) defining baseline test cost, while the cost of misclassification remains as $L_{\epsilon rr}$. The overall cost as a function of $\lambda$ is thus $$C(\lambda) = L_{Err}(\tilde{a}(\lambda)) + c_T \sum_{k \in \tilde{K}(\lambda)} T_k.$$

The optimal test cost is thus reached for $$\hat{\lambda} = \underset{\lambda}{\mathrm{argmin}}\{C(\lambda)\}$$

with optimal test cost $$\hat{C} = C(\hat{\lambda})$$

and optimal test subset $$\hat{K} = \tilde{K}(\tilde{a}(\hat{\lambda})).$$

The apparatus may adapt the least absolute shrinkage and selection operator as to determine a further test and a further decision function, e.g. by variation of the Lagrange multiplier. The further decision function is applicable to measurements from an additional device under test tested using the subset of tests extended by the further test (also referred to as extended subset of tests), such that the further single decision function is adapted to predict a test result for the set of tests on the basis of the subset of tests extended by the further test. In other words, by variation of the Lagrange multiplier, the number of remaining basis functions may be increased (since coefficient vector a related to the basis functions) and therefore, the fitting of the single decision function to the ideal decision function may be Improved. Thus, by variation of the Lagrange multiplier, a ranking of the basis functions and therefore the tests may be obtained, according with the corresponding decision function.

However, since more basis functions are Involved, more tests have to be performed to obtain a classification result. This is due to the fact that typically, each further basis function uses a further test. Thus, a decision function having more basis functions comprises more variables for the respective tests. Thus, such a further single decision function comprising more basis functions should be more accurate and therefore be used if the previously used decision function fails to provide an explicit result whether the current device under test passes the test or fails to pass the test. In other words, the previously used decision function may indicate that it is the cheapest to perform a further test instead of classifying the current device under test as being good or bad. Thus, by adapting the Lagrange multiplier, the relevance of the subset of tests indicating whether the plurality of devices under test pass the tests (or fail to pass the tests) can be increased or decreased.

Therefore, as to determine the cheapest (optimal) classification result, the apparatus may perform the fitting by optimizing a loss function reflecting the costs for misclassification of a device under test and the costs to perform a further test on the device under test. This fitting is described above and regarding the costs, in the subsequent section.

Decision Thresholds According to an Embodiment (Block 200)

This may be the last step. According to embodiments, the idea is to apply the full test or at least the extended set of tests, if the decision variable is too close to the decision threshold and the risk of escapes or yield loss is too high. In general, it shall be applied an extended test, which may be the full test. Embodiments for finding cost-optimal decision thresholds for 'Fail'. 'More test', and 'Pass' are shown with respect to FIGS. 22a-d.

Distributions

Figure 22A:
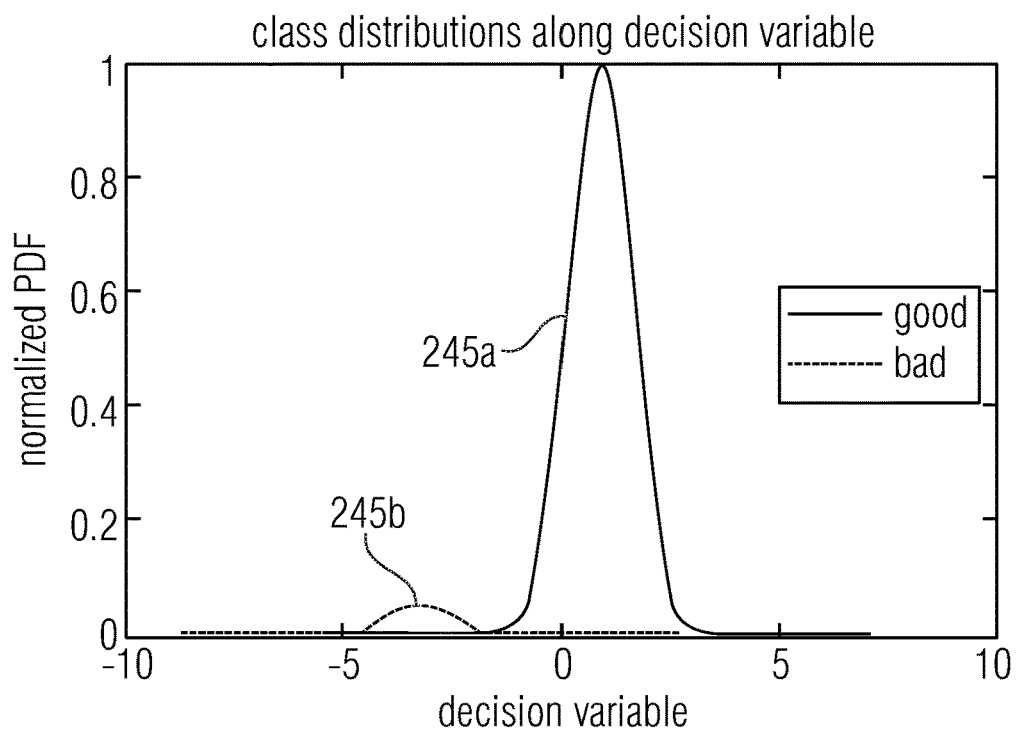
FIG. 22a shows a schematic diagram of the class distributions of good and bad devices along the decision variable as a schematic diagram of the normalized PDF (probability density function) over the decision variable.

For the training set, distributions of good and bad devices, $p_G(\tilde{d}), p_B(\tilde{d})$ 185, along the predicted decision variable d are collected, e.g. using block 190. FIG. 22a shows the class distributions of good and bad devices along the decision variable as a schematic diagram of the normalized PDF (probability density function) over the decision variable. Graph 245a refers to good devices and graph 245b refers to bad devices.

Figure 22B:
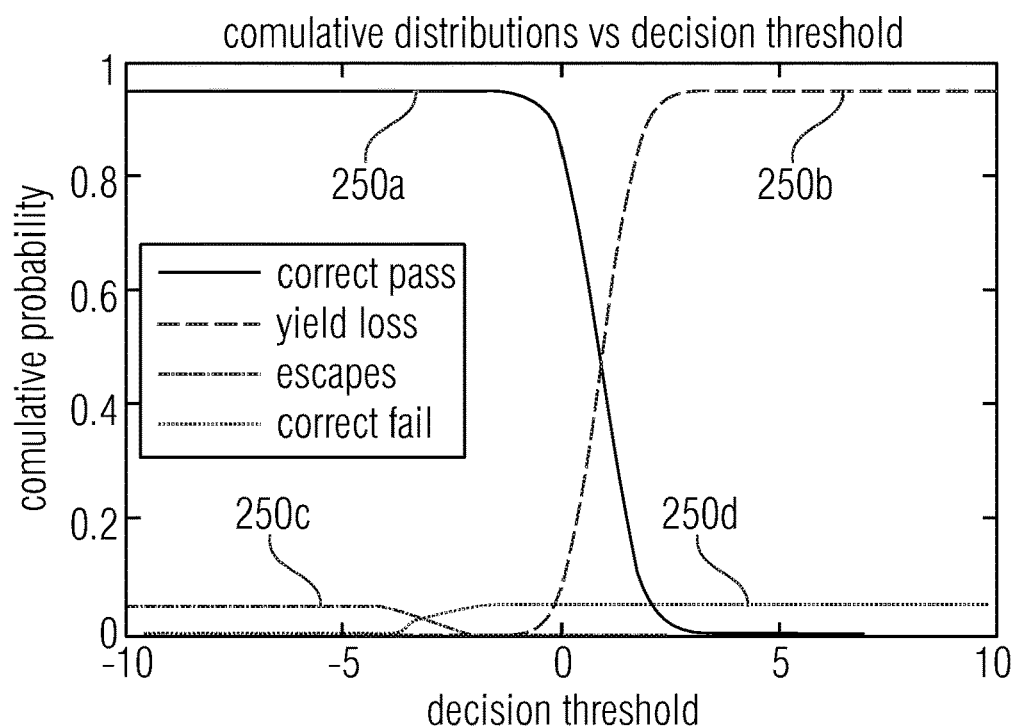
FIG. 22b shows a schematic diagram of a cumulative distributions as a cumulative probability over the decision threshold in a schematic diagram.

Cost of escapes and yield loss for decision threshold d are $$C_E(\tilde{d}_{PF}) = c_E P_B(\tilde{d} > \tilde{d}_{PF})$$

$$C_{YL}(\tilde{d}_{PF}) = c_{YL} P_G(\tilde{d} < \tilde{d}_{PF}).$$

with cumulative distributions. FIG. 22b shows cumulative distributions as a cumulative probability over the decision threshold in a schematic diagram. Graph 250a indicates correct passes, graph 250b yield loss, graph 250c escapes and graph 250d correct fails.

$$P_B(\tilde{d} > \tilde{d}_{PF}) = \int_{\tilde{d}_{PF}}^{\infty} p_B(v) dv$$

$$P_G(\tilde{d} < \tilde{d}_{PF}) = \int_{-\infty}^{\tilde{d}_{PF}} p_G(v) dv$$

Figure 22C:
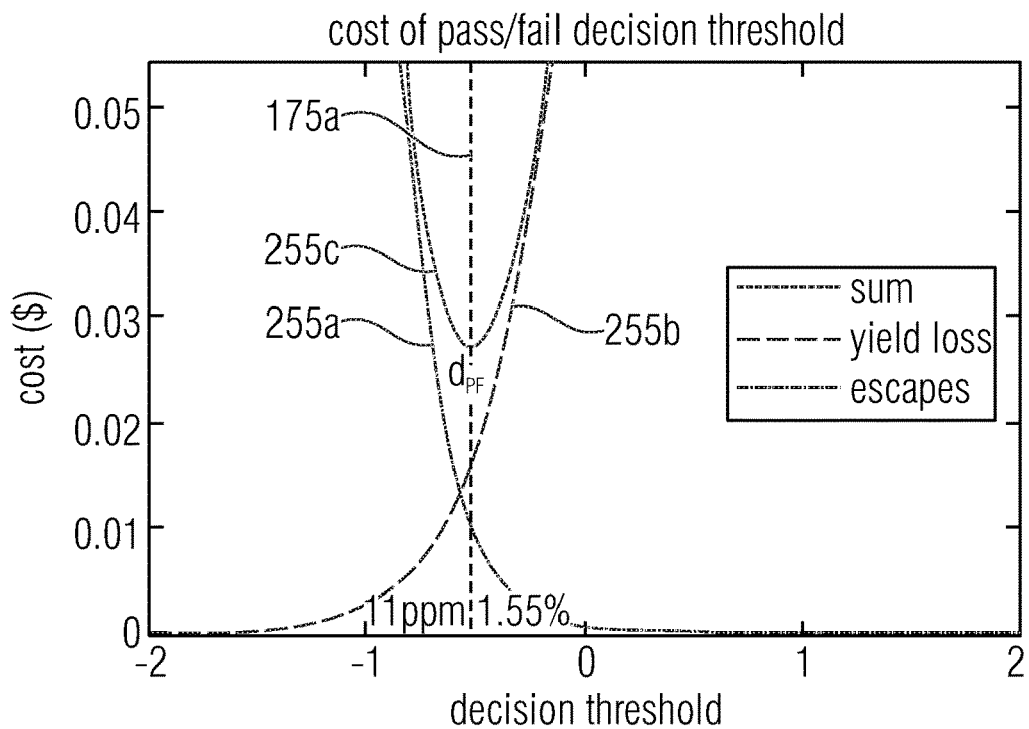
FIG. 22c shows a schematic diagram of the (monetary) cost of yield loss, escapes, and the sum of both (and therefore the cost of pass/fail decisions) over the decision threshold in a schematic diagram.

Pass/Fail Decision without Additional Test e.g. Performed in Block 200 According to an Embodiment The optimum pass/fail decision threshold $\tilde{d}_{PF}$, still without considering additional test, is where the combined cost of escapes and cost of yield loss is minimum. FIG. 22c shows the (monetary) cost of yield loss, escapes, and the sum of both (and therefore the cost of pass/fail decisions) over the decision threshold in a schematic diagram. Graph 255a indicates the escapes, graph 255b yield loss and graph 255c the sum of the previous graphs. Dashed line 175a indicates the pass/fail decision threshold $\tilde{d}_{PF}$:

$$\tilde{d}_{PF} = \underset{d}{\mathrm{argmin}}(C_E(d) + C_{YL}(d))$$

Thus, the apparatus may determine a decision threshold applicable to the single decision function using a distribution of a subset of the plurality of devices under test along the decision variable indicating, when applying the measurements of the plurality of devices under test related to the subset of tests to the single decision function, to pass the set of tests. The threshold at the single decision function indicates whether the device under test passes the set of test or fails to pass the set of tests.

Decision Thresholds for Additional Test e.g. Performed in Block 200 According to Embodiments Following is described the determination of the threshold between more test and pass.

Figure 22D:
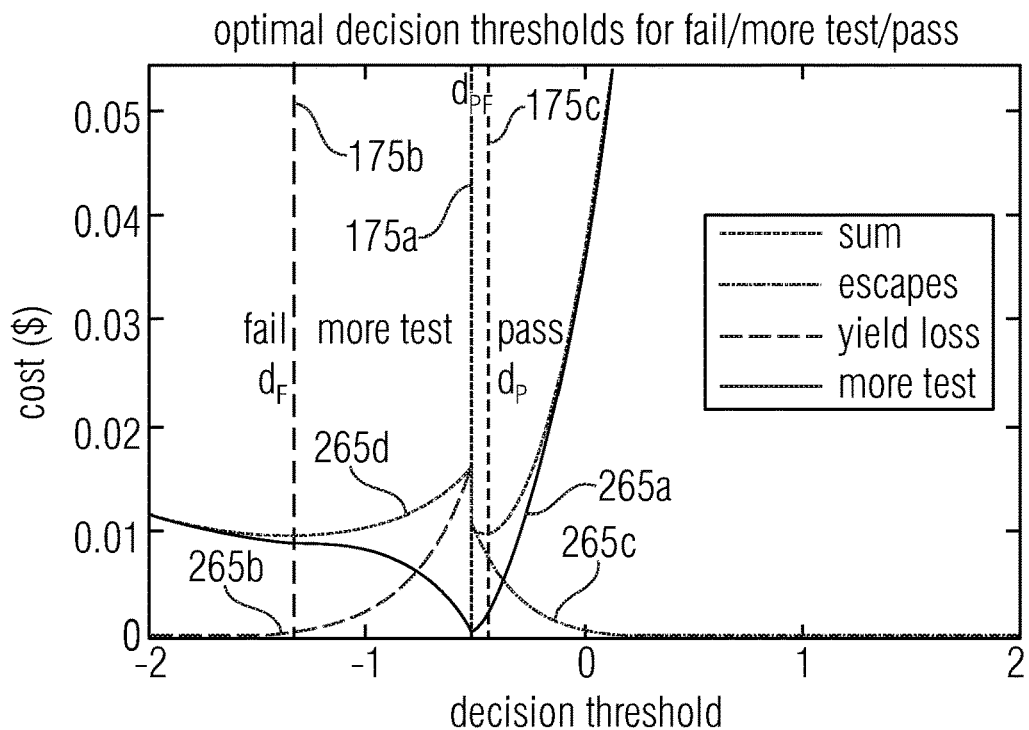
FIG. 22d shows a schematic diagram of the (monetary) cost for more test, yield loss, escapes and the sum of the previous (and therefore optimal decision thresholds for pass, more test, and fail) over the decision threshold in a schematic diagram.

FIG. 22d shows the (monetary) cost for more test, yield loss, escapes and the sum of the previous (and therefore optimal decision thresholds for pass, more test, and fail) over the decision threshold in a schematic diagram. Graph 265a indicates more test, graph 265b yield loss, graph 265c escapes, and graph 265d the sum of the three previously named graphs. Dashed line 175b Indicates the decision boundary for fail $d_F$ and dashed line 175c indicates the decision boundary for pass $d_P$. Between the decision boundaries is the area, where more testing may be applied to get a robust pass/fail classification. The threshold $\tilde{d}_{PF}$ 175 from FIG. 22c is applied for comparison. Thus, a single threshold Indicating a pass/fail threshold may be at a different position when compared to a threshold indicating a pass/more test threshold and a further threshold indicating a more test/fail threshold. The optimum pass threshold $\tilde{d}_P \geq \tilde{d}_{PF}$ is where the combined cost of applying full test with test time T to all devices with decision variable In interval $\tilde{d}_{PF} \leq \tilde{d} < \tilde{d}_P$ (integral term) and cost of escapes above $d_P$ (right term) is minimum.

$$\tilde{d}_P = \underset{d_P}{\mathrm{argmin}}\left\{c_T T \int_{\tilde{d}_{PF}}^{d_P}(p_G(v) + p_B(v))dv + c_E P_B(\tilde{d} > d_P)\right\}$$

Similarly for the fail threshold:

$$\tilde{d}_F = \underset{d_F}{\mathrm{argmin}}\left\{c_T T \int_{d_F}^{\tilde{d}_{PF}}(p_G(v) + p_B(v))dv + c_{YL} P_G(\tilde{d} < d_F)\right\}$$

The graphs of FIG. 22a-d are obtained using the following exemplary values.

Cost of full test time $C_T$=0.15\$
Cost of reduced (subset) test time $C_T$=0.05\$
Cost per (lost) device $C_{YL}$=1\$
Cost of escape $C_\epsilon$=1000\$
Number of sites $N_{Smes}$=4
Yield 95%
Good devices: mean, standard deviation $\bar{x}_G$=1, $\sigma_G$=1
Bad devices: mean, standard deviation $\bar{x}_B$=−3, $\sigma_B$=1

Furthermore, an exemplary result report is shown in FIG. 23.

Further embodiments of the invention such as to predict eliminated measurements relate to the following examples:

1. Classification based on one smooth scalar decision variable
2. Scalar decision variable is sigmoid function of quality metric so that it changes most around decision boundary.
3. Scalar decision variable based on compressed quality metric
4. Quality metric based on specification margin
5. Quality metric for outlier detection, e.g. Mahalanobls distance
6. Scalar decision function models overall (monetary) cost (in the sense of \$/€, not as generalized 'cost' function)
   a. Cost contribution from escapes, yield loss
      i. Modeled as weighted 2-norm
   b. Cost contribution from more test
   c. Cost contribution from test time
      i. Modeled as weighted 1-norm or 2-norm regularization
7. Optimize pass/fail threshold along decision variable for lowest cost of test
8. Optimize 'More Test' decision threshold along decision variable for lowest cost of test 9. Regression to smooth scalar decision function (as opposed to Boolean function or as opposed to regression to eliminated measurements)
   a. Basis functions suitable to best approximate sigmoid decision functions
   b. Test subset selection using LASSO regression
      i. Loss function models test cost
      ii. Cost of classification errors modeled as weighted 2-norm
      iii. Cost of test time modeled as weighted 1-norm regularization Although the present invention has been described in the context of block diagrams where the blocks represent actual or logical hardware components, the present invention can also be implemented by a computer-implemented method. In the latter case, the blocks represent corresponding method steps where these steps stand for the functionalities performed by corresponding logical or physical hardware blocks.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive transmitted or encoded signal can be stored on a digital storage medium or can be transmitted on a transmission medium such as a wireless transmission medium or a wired transmission medium such as the Internet.

Depending on certain implementation requirements, embodiments of the Invention can be implemented in hardware or in software. The implementation can be performed using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non-transitory.

A further embodiment of the Invention method is, therefore, a data stream or a sequence of signals representing the computer program for performing one of the methods described herein. The date stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein, in some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

NOMENCLATURE

General Notation
N Absolute value of scalar
x Column vector
x' Transpose of vector, row vector
$\|x\|_1$ $L_1$ norm of vector, sum of absolute values
$\|x\|_{1W}$ Weighted $L_1$ norm of vector.
$\|x\|_2$ $L_2$ norm of vector, sum of squares
$\|x\|_{2W}$ Weighted $L_2$ norm of vector.
X Matrix
$(X)_{ij}=X_{ij}$ Matrix element in row i and column j
X' Transposed matrix
X Set
|X| Number of elements in set
$\tilde{x}$ Quantity related to remaining tests after test selection
$\bar{x}$ Quantity related to removed tests after test selection
$\underline{x}$ Lower limit
$\dot{x}$ Upper limit
$\hat{x}$ Optimal value
Symbols
a,ã J×1 coefficient vector based on all/subset of measurements $b_j(x), \tilde{b}_j(i)$ Basis function j based on all/subset of measurements $B, \bar{B}$ N×J matrix with values of basis functions for all/subset of measurements $C, C_E, C_{YL}, C_Y, C_M$ Total cost, escape cost, yield loss cost, test time cost, cost of more test $c_T$ Test cost rate per test time $c_E, c_{YL}, c_M$ Test cost per escaped/lost/more tested device $d(x), \bar{d}(\tilde{x})$ Decision variable based on all/subset of measurements $d_n = d(x_n)$ Decision variable for device n $d, d'$ N×1 vector with decision variables for all devices from all/subset of tests $\hat{d}_{PF}$ Decision threshold for pass/fail decision without option for more test $\tilde{d}_F$ Decision threshold between more test and failing a device $\hat{d}_P$ Decision threshold between more test and passing a device $\gamma(x), \tilde{\gamma}(\tilde{x})$ Classification function based on all/subset of measurements $\hat{f}(.), \hat{f}_a(\bar{x})$ Fitting function based on measurement subset and coefficient vector ã

$g(.), g(q(x))$ Compression function applied to quality metric $\eta$ Compression factor of compression function $g(.)$ J Number of basis functions K Number of tests $K, \bar{K}, \underline{K}$ Set of all/selected/eliminated test numbers $K^i$ Set of test numbers needed for basis function..

$L, L_{Err}$ Total loss function for fitting, part for classification errors $\lambda$ Lagrange multiplier for Ridge or Lasso shrinkage M Number of measurements $M, \bar{M}, \underline{M}$ Set of all/selected/eliminated measurement numbers $M_x$ Set of measurement numbers in test k $M^j$ Set of measurement numbers needed for basis function j $\mu, \tilde{\mu}$ Mahalanobis distance, its limit N Number of devices N Set of device numbers $p_E, p_{YL}, p_M$ Probability of escape, yield loss, more test selected $p_G(\bar{d}), p_B(\bar{d})$ Probability density for good/bad devices at decision variable value $\bar{d}$ $P_G(d<d_{PF})$ Cumulative probability that good device has decision variable $d<d_{PF}$ $P_B(d>d_{PF})$ Cumulative probability that bad device has decision variable $d>d_{PF}$ $q(x)$ Quality metric for devices with measurements x $Q_{nm}$ Quality metric for measurement m of device n $Q_{n,m}$ Smallest quality metric for device n across all measurements $R, R_{ij}$ m×M covariance matrix of measurements, its elements S Number of sites in multi-site test $\sigma_m$ Standard deviation of measurement value m $T, T_j, T(K)$ Total test time/for test k/for set of tests K $\partial_m$ Importance metric for measurement m $\theta_k$ Importance metric for test k $v_j$ Coefficient weight for basis function J $V, V_k$ Diagonal J×J matrix with coefficient weights for basis functions $w_n$ Weight in loss function for device n $W, W_{nn}$ vDiagonal N×N matrix with weights $\omega$ Compression factor in weights w, for devices $x_m$ Measurement value m $x, x_n$ 1×M vector with measurement of unnamed device/device n $\bar{x}, \hat{x}_n$ 1×$\bar{M}$ vector with subset of measurements of unnamed device/device n $\bar{x}_m$ Average value of measurement m across all devices $\hat{x}_m$ Lower specification limit for measurement m $\tilde{x}_m$ Upper specification limit for measurement m $X, X_{nm}$ N×M matrix with all measurement values $X_{nm}$ of all devices $\xi_m$ Translation of measurement m in basis function

The invention claimed is:

1. An apparatus for determining a single decision function, the apparatus comprising:
a stimulating device configured to apply stimulating signals to a plurality of devices under test; and
a processor configured to:
acquire measurements from the plurality of devices under test, the measurements corresponding to the stimulating signals applied to the plurality of devices under test, wherein the stimulating signals correspond to a set of tests performed on the plurality of devices under test;
determine a subset of tests from the set of tests wherein the subset of tests is relevant for indicating whether the plurality of devices under test pass the set of tests; and
determine the single decision function applicable to measurements from an additional device under test that is tested using the subset of tests, wherein the single decision function predicts a test result for the set of tests on the basis of the subset of tests.

2. The apparatus according to claim 1, wherein the processor is further configured to determine another test from the set of tests and to add the another test to the subset of tests to form an extended subset of tests with an increased relevance for indicating whether the plurality of devices under test pass the set of tests, and wherein the processor is further configured to determine another single decision function applicable to measurements from the additional device under test tested using the extended subset of tests, wherein the another single decision function predicts the test result for the set of tests on the basis of the extended subset of tests.

3. The apparatus according to claim 1, wherein the processor is further configured to determine unusual combinations of the measurements corresponding to the stimulating signals of the subset of tests applied to the plurality of devices under test and to determine the single decision function, wherein if the single decision function is applied to measurements of the additional device under test using the subset of tests, the single decision function predicts the test result indicating that the additional device under test fails to pass the set of tests.

4. The apparatus according to claim 1, wherein the processor is further configured to determine the decision function based on measurements from the subset of tests using discriminant analysis.

5. The apparatus according to claim 1, wherein the processor is further configured to form an ideal decision function using a quality metric and to fit the single decision function to the ideal decision function, wherein if the single decision function is applied to a combination of the measurements, a quality measure is acquired indicating whether the combination of the measurements contributes to identifying whether the additional device under test passes the test.

6. The apparatus according to claim 5, wherein the processor is further configured to use a Mahalanobis distance as the quality measure, and wherein the Mahalanobis distance penalizes unusual combinations of measurements indicating that a respective device under test that reveals such an unusual combination of measurements fails to pass the test.

7. The apparatus according to claim 5, wherein the processor is further configured to apply a compression function to the quality measure, wherein a curve shape of the single decision function around a decision threshold is emphasized, and wherein the decision threshold divides areas of the single decision function that indicate a device under test will pass the tests from an area of the single decision function that indicate a device under test will fail to pass the tests.

8. The apparatus according to claim 1, wherein the processor is further configured to determine the single decision function using a set of basis functions reflecting the set of tests, by fitting the set of basis functions to an ideal decision function, and to use a least absolute shrinkage and selection operator (LASSO) to determine the single decision function and to determine the subset of tests.

9. The apparatus according to claim 8, wherein the processor is further configured to adapt the least absolute shrinkage and selection operator to determine another test and another decision function, wherein the another decision function is applicable to measurements from an additional device under test that is tested using the subset of tests extended by the another test, wherein the further single decision function predicts a test result for the set of tests on a basis of the subset of tests extended by the another test.

10. The apparatus according to claim 8, wherein the processor is further configured to perform the fitting by improving a loss function by reflecting costs for misclassification of a device under test and costs to perform another test on the additional device under test.

11. The apparatus according to claim 1, wherein the processor is further configured determine the single decision function using a set of basis functions reflecting the subset of tests and by fitting the set of basis functions to an ideal decision function using Ridge regression to improve a loss function.

12. The apparatus according to claim 11, wherein the processor is further configured to perform the fitting by improving the loss function by reflecting costs for misclassification of a device under test and the costs to perform another test on the additional device under test.

13. The apparatus according to claim 1, wherein the processor is further configured to determine a decision threshold applicable to the single decision function using a distribution of a subset of the plurality of devices under test along the decision variable, wherein the decision threshold indicates when applying the measurements of the plurality of devices under test to the single decision function, a passing of the set of tests, and
wherein the threshold at the single decision function indicates whether the additional device under test passes the set of tests.

14. The apparatus according to claim 13, wherein the processor is further configured to determine another decision threshold applicable to the single decision function using a distribution of the subset of the plurality of devices under test along the decision variable, wherein the another decision threshold indicates when applying the measurements of the plurality of devices under test related to the subset of tests to the single decision function, a failure to pass the set of tests, and
wherein the decision threshold is set to a different position of the decision function than the another decision threshold to acquire three areas indicating whether the additional device under test passes the test, fails to pass the test, and whether a further test is to be performed to decide whether the additional device under test passes the test or fails to pass the test.

15. A tester for testing a device under test, the tester comprising:
a stimulating device configured to apply stimulating signals according to a subset of a set of tests to the device under test; and
a signal processor configured to acquire measurements from the device under test the measurements corresponding to the stimulating signals and configured to decide, based on a single decision function applied to the measurements, whether the device under test is predicted to pass the set of tests,
wherein the single decision function predicts a test result for the set of tests on the basis of the subset of tests.

16. The tester according to claim 15,
wherein the stimulating device is further configured to apply another stimulating signal according to another test of the set of tests to the device under test if the decision function yields an ambiguous result, wherein the ambiguous result indicates that the another test be performed on the device under test to decide whether the device under test passes the set of tests, and wherein the subset of tests and the another test form an extended subset of tests;
wherein the signal processor is configured to acquire another measurement from the device under test corresponding to the another stimulating signal and to decide, based on another single decision function applied to the measurements and the another measurement, whether the device under test is predicted 4o pass the set of tests,
wherein the another single decision function predicts a test result for the set of tests on a basis of the extended subset of tests.

17. A method of testing a device under test, the method comprising:
applying stimulating signals according to a subset of a set of tests to the device under test; and
acquiring measurements from the device under test corresponding to the stimulating signals and deciding, based on a single decision function applied to the measurements, whether the device under test is predicted to pass the set of tests;
wherein the single decision function predicts a test result for the set of tests on the basis of the subset of tests.

18. A method of determining a single decision function, wherein the method comprises:
acquiring measurements from a plurality of devices under test the measurements corresponding to stimulating signals applied to the plurality of devices under test, wherein the stimulating signals correspond to a set of tests performed on the plurality of devices under test;
determining a subset of tests from the set of tests, such that the subset of tests that is relevant for indicating whether the plurality of devices under test pass the set of tests; and
determining the single decision function applicable to measurements from an additional device under test that is tested using the subset of tests, wherein the single decision function predicts a test result for the set of tests on the basis of the subset of tests.

19. A non-transitory machine-readable storage medium having a computer program stored thereon to perform a method of determining a single decision function, the method comprising:
- acquiring measurements from a plurality of devices under test the measurements corresponding to stimulating signals applied to the plurality of devices under test, wherein the stimulating signals correspond to a set of tests performed on the plurality of devices under test;
- determining a subset of tests from the set of tests, such that the subset of tests that is relevant for indicating whether the plurality of devices under test pass the set of tests; and
- determining the single decision function applicable to measurements from an additional device under test tested using the subset of tests, wherein the single decision function predicts a test result for the set of tests on the basis of the subset of tests.

20. The non-transitory medium of claim 19, wherein the method further comprises:
- determining another test from the set of tests and to add the further test to the subset of tests to form an extended subset of tests with improved relevance for indicating whether the plurality of devices under test pass the set of tests; and
- determining another single decision function applicable to measurements from the additional device under test tested using the extended subset of tests, wherein the another single decision function predicts the test result for the set of tests on a basis of the extended subset of tests.

* * * * *